United States Patent [19]
Tsuji et al.

[11] Patent Number: 6,025,650
[45] Date of Patent: *Feb. 15, 2000

[54] SEMICONDUCTOR DEVICE INCLUDING A FRAME TERMINAL

[75] Inventors: Kazuto Tsuji; Yoshiyuki Yoneda; Hideharu Sakoda; Ryuuji Nomoto; Eiji Watanabe; Seiichi Orimo; Masanori Onodera; Junichi Kasai, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/961,243

[22] Filed: Oct. 30, 1997

Related U.S. Application Data

[63] Continuation of application No. 08/463,050, Jun. 5, 1995, abandoned.

[30] Foreign Application Priority Data

Aug. 24, 1994 [JP] Japan ..................... 6-199845
Mar. 9, 1995 [JP] Japan ..................... 7-050054

[51] Int. Cl.⁷ ............... H01L 23/48; H01L 29/41
[52] U.S. Cl. ............... 257/786; 257/787; 257/790; 257/778; 257/691; 257/697; 257/698; 257/668; 257/676
[58] Field of Search ............... 257/787, 790, 257/778, 786, 690, 691, 693, 697, 698, 668, 676

[56] References Cited

U.S. PATENT DOCUMENTS

| | | | |
|---|---|---|---|
| 5,293,072 | 3/1994 | Tsuji et al. | 257/676 |
| 5,355,283 | 10/1994 | Marrs et al. | 257/787 |
| 5,475,236 | 12/1995 | Yoshizaki | 257/786 |
| 5,508,556 | 4/1996 | Lin | 257/691 |

FOREIGN PATENT DOCUMENTS

| | | | |
|---|---|---|---|
| 0158352 | 7/1987 | Japan | 257/666 |
| 0025419 | 2/1991 | Japan | 257/786 |
| 0221837 | 8/1992 | Japan | 257/786 |

*Primary Examiner*—Wael Fahmy
*Assistant Examiner*—Hung Van Duong
*Attorney, Agent, or Firm*—Armstrong, Westerman, Hattori, McLeland & Naughton

[57] ABSTRACT

This invention relates to a semiconductor device in which a plurality of outer terminals are arranged in a lattice formation on a flat surface. The semiconductor device comprises a semiconductor chip having a plurality of pads, a resin portion sealing said semiconductor chip and a terminal portion in which a prescribed number of pole terminals electrically connected to said pads provided in said semiconductor chip are provided, said pole terminals being exposed from said resin portion. According to the invention, a cost for production is reduced and a reliability and electrical characteristics can be improved.

15 Claims, 31 Drawing Sheets

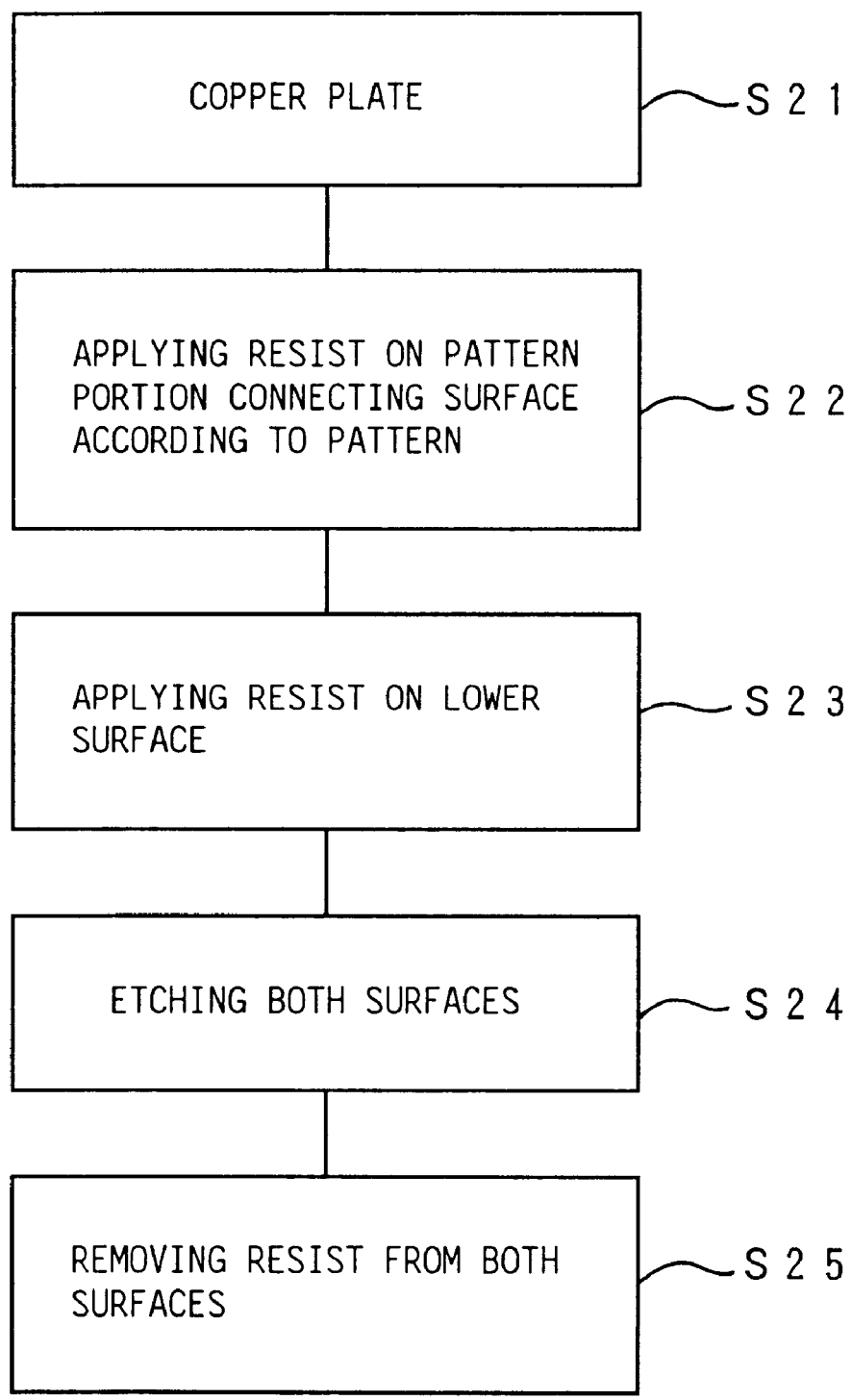

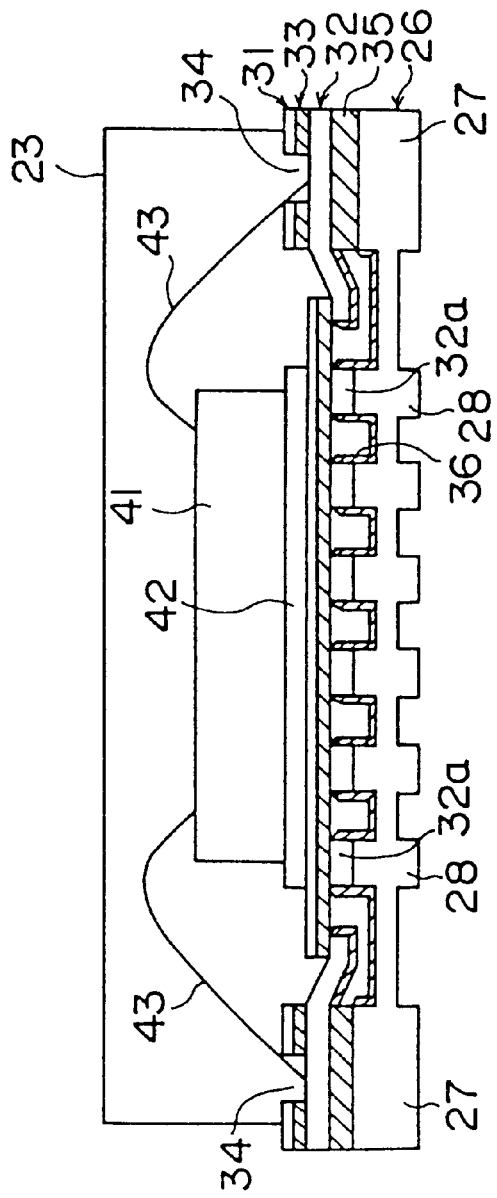
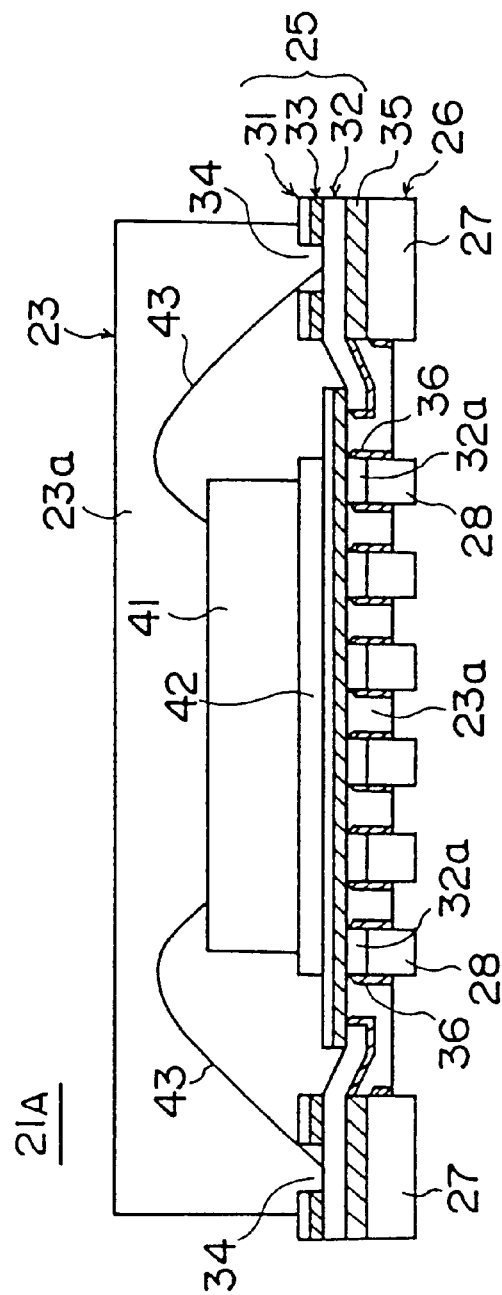
FIG. 12A
FIG. 12B

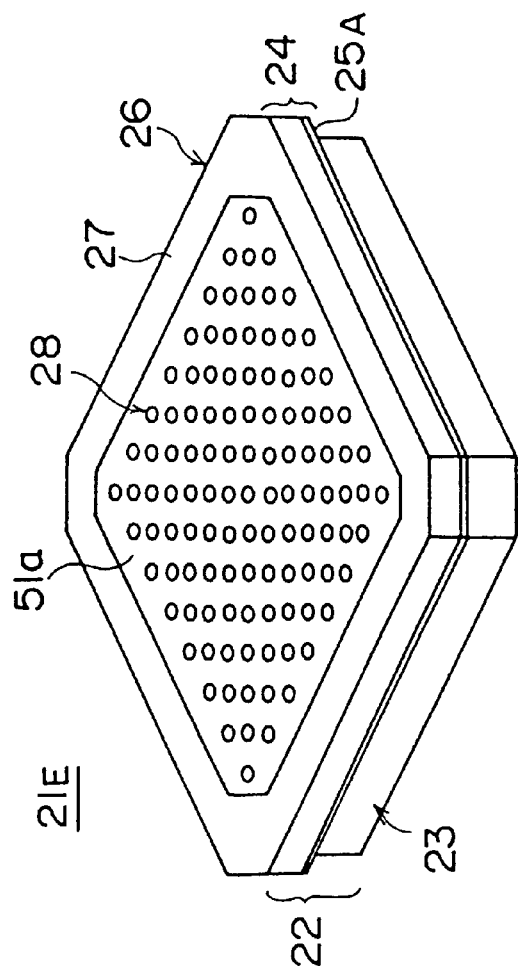
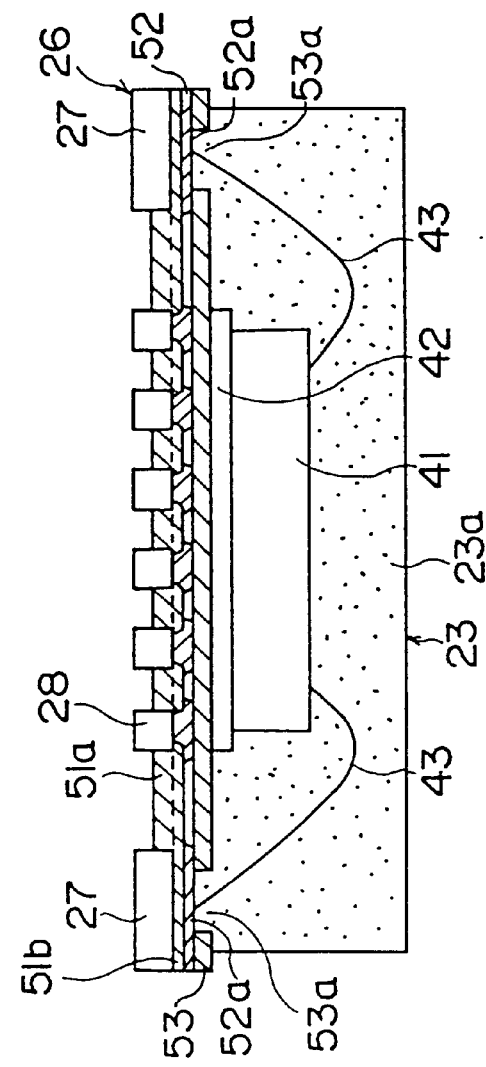
FIG. 15A
FIG. 15B

SEMICONDUCTOR DEVICE INCLUDING A FRAME TERMINAL

This application is a continuation of application Ser. No. 08/463,050 filed Jun. 5, 1995, now abandoned.

BACKGROUND OF THE INVENTION

1. Field of the Invention

The present invention generally relates to a semiconductor device and a method for producing thereof, and more particularly to a semiconductor device in which a plurality of outer terminals are arranged in a lattice formation on a flat surface and a method for producing thereof.

2. Description of the Prior Art

Currently, with a need for small, thin, high-speed and high-performance electrical appliances, a demand for small, high-density and high-performance semiconductor devices is increasing. In order to respond to the demand, a QFP (Quad Flat Package) type semiconductor device and a QTP (Quad Tape-carrier Package) type semiconductor device have been gradually replaced by μBGA-type semiconductors using BGA (Ball Grid Array) techniques or TAB (Tape Automated Bonding) techniques. Also, a reliability and electrical characteristics of the small-size semiconductor devices are desired to be improved.

FIGS. 1A, 1B are schematic illustrations showing a conventional μBGA-package-type semiconductor device. FIG. 1A is a sectional view and FIG. 1B is a plan view.

In a semiconductor device 11 shown in FIGS. 1A and 1B, a prescribed number of pads 13 are provided on a semiconductor chip 12. On the semiconductor chip 12 except where the pads 13 are provided, an elastic adhesive 14 is applied. Around the semiconductor chip 12, a frame member 16 made of, for example, a metal, for protecting the semiconductor chip 12 and for releasing heat generated by the semiconductor chip 12, is secured through an adhesive 15a. An adhesive 15b is supplied on the frame member 16.

On the other hand, a pattern 18 of copper foil is provided on a resin film 17 of, for example, polyimide (PI). The pattern 18 comprises outer pads 18a and leads 18b extended from the outer pads 18a in order to constitute a TC (Tape Carrier) structure. Also, holes 19 are formed in the resin film 17 at positions corresponding to the outer pads 18a. In the holes 19, ball electrodes 20 of gold or solder connected to the outer pads 18a are provided in a lattice formation. A pitch of the ball electrodes is, for example, 0.5 mm. These ball electrodes 20 function as outer terminals.

The resin film 17 is bonded on the above-mentioned adhesive 14, 15b. The lead 18b extended from the pattern 18 is connected to the pads 13 of the semiconductor chip 12 by, for example, welding. These portions are sealed by a resin 15c of, for example, epoxy resin. The semiconductor device 11 is formed in the μBGA package structure in which the ball electrodes 20 are provided in a size similar to the semiconductor chip size.

A flat size of the semiconductor device 11 is determined by the semiconductor chip size, a number of terminals and a terminal pitch.

That is, when an area determined by the number of the pads and the terminal pitch does not exceed an area of the semiconductor chip 12, the flat size of the semiconductor device 12 is determined by the pads provided on the semiconductor chip 12 being outside of the outer terminals arranged in a lattice formation.

On the contrary, when an area determined by the number of the pads and the terminal pitch exceeds the area of the semiconductor chip 12, the pads are not always outside of the outer terminal, and a flat area of the semiconductor device is determined by an area surrounded by the outer terminals arranged in a lattice formation.

However, since the TAB method is used for the connection between the semiconductor chip 12 and the outer terminals, the semiconductor device 11 does not have a flexibility.

Also, when all the outer terminals are provided on the semiconductor chip 12, packing is difficult. For example, when more than 324 pins are provided, and a pitch for the pads is less than 80 μm, a pitch for the outer terminals is required to be less than 0.4 mm. On the other hand, when a pitch for the outer terminals is more than 0.5 mm, the semiconductor chip 12 is required to be increased in size, and a total cost therefor becomes higher.

Also, since the outer terminals (bump electrodes 20) are required to be plated in a production of the semiconductor device 11, a cost for the production is increased.

Further, since a part of the semiconductor chip 12 is exposed in the conventional semiconductor device 11, a reliability thereof is lowered.

SUMMARY OF THE INVENTION

Accordingly, it is a general object of the present invention to provide a novel and useful semiconductor device and a method for producing thereof by which a cost for production is reduced and a reliability and electrical characteristics can be improved.

The above object of the present invention is achieved by a semiconductor device comprising a semiconductor chip having a plurality of pads, a resin portion sealing the semiconductor chip, and a terminal portion in which a prescribed number of pole terminals electrically connected to the pads provided in the semiconductor chip are provided, the pole terminals being exposed from the resin portion. The above invention can further include a frame terminal provided in the terminal portion.

According to the above invention, since the terminal portion can be provided easily regardless of a size or a position of the semiconductor chip, a flexibility of the semiconductor device can be improved and production thereof can be conducted economically. Also, by using the pole terminals as power supply terminals, a reliability and electric characteristics can be improved.

In the above invention, the pole terminals can be arranged in a lattice formation and at least the frame terminal is arranged around the pole terminals. In the above invention, the terminal portion can include an outer terminal comprising the frame terminal and the pole terminals and a pattern portion comprising connecting portions on which the semiconductor chip is mounted, the connecting portions being connected to the pads, and terminal connecting portions connected to the frame terminal and the pole terminals. According to the above invention, the semiconductor device can cope with different layouts or different sizes of semiconductor chips. Therefore, a flexibility of packages structure can be realized and a production thereof can be conducted economically.

In the above invention, the pattern portion can includes a base layer on which the semiconductor chip is mounting and a pattern layer in which the connecting portions and the terminal connecting portions are provided, the pattern layer being formed on the base layer. Also, the above invention, the base layer can be made of one of an insulating film and a metal plate member. Also, in the above invention, an opening portion can be formed in the base layer at a position corresponding to the connecting portions of the pattern layer, and the pads provided in the semiconductor chip are electrically connected to the connecting portions through wires. Further, in the above invention, the connecting portions of the pattern layer can be arranged above the frame terminal provided in a periphery of the outer terminal. According to the invention, a connection to the semiconductor chip can be made easily and securely.

In the above invention, the pads provided in the semiconductor chip can be arranged in two lines along edges of the semiconductor chip, and the connecting portions of the pattern layer can be arranged in a staggered formation to the pads. Also, in the above invention, the pads arranged close to the connecting portions can be connected to the connecting portions arranged close to the semiconductor chip through wires forming arcs of certain radius, and the pads arranged apart from to the connecting portions can be connected to the connecting portions arranged apart from the semiconductor chip through wires forming arcs of different radius. According to the above invention, contact between the wires can be prevented and a density of the pads and the connecting portions can be improved.

In the above invention, the terminal connecting portions of the pattern layer can be electrically connected to the pole terminals and the frame terminal in the outer terminal through plating portions. According to the invention, an electric connection between the outer terminal portion and the pattern portion can be made securely.

In the above invention, a plurality of frame terminals can be provided, some of the frame terminals being provided amongst the pole terminals and the rest of the frame terminals being provided in a periphery of the pole terminals. Also, in the above invention, the frame terminal can be divided into at least two parts. Further, in the above invention, the frame terminal can function as a power supply terminal or a grounding terminal. According to the invention, both anti-noise characteristics and electrical characteristics can be improved.

The above object of the present invention is also achieved by a method for producing a semiconductor device, comprising the steps of preparing an outer terminal portion in which a plurality of terminals are formed in series through thin portions, preparing a pattern portion having terminal connecting portions corresponding to the terminals and a pattern layer having connecting portions to be electrically connected to a semiconductor chip, connecting the pattern portion to the outer terminal portion, mounting the semiconductor chip on the pattern portion, connecting electrically the semiconductor chip to the connecting portions of the pattern layer, exposing the outer terminal portion, sealing the semiconductor chip with a resin, and separating the terminals respectively in the outer terminal portion. According to the invention, a flexible semiconductor device which can cope with various sizes of the semiconductor chip can be produced economically.

The above object of the present invention is also achieved by a method for producing a semiconductor device, comprising the steps of preparing an outer terminal portion in which a plurality of terminals are formed in series through thin portions, forming an insulating layer on the outer terminal portion, the terminals being exposed from the insulating layer, forming a pattern layer in which connecting portions to be connected to a semiconductor chip are patterned, the pattern layer connecting the terminals, forming an upper insulating layer in which an opening portion from which the connecting portions are exposed is formed, mounting the semiconductor chip on the upper insulating layer, connecting electrically the semiconductor chip to the connecting portions of the pattern layer, exposing the outer terminal portion, sealing the semiconductor chip with a resin, and separating the terminals respectively in the outer terminal portion. In the above invention, the terminals can be a prescribed number of pole terminals. Also, in the above invention, some of the terminals can be a plurality of pole terminals and the rest of the terminals are a frame terminals. According to the above invention, a flexibility of the semiconductor device is improved and even semiconductor devices having different sizes of semiconductor chips can be produced economically.

The above invention can further include step of plating the frame terminals and the pole terminals respectively separated for packaging. According to the invention, separated frame terminals and pole terminals are plated. Accordingly, a connection to the substrate can be made easily.

In the above invention, the semiconductor chip can be electrically connected to the pattern layer via wires above the frame terminals. Also, in the above invention, the semiconductor chip can be electrically connected to the pattern layer via wires above the frame terminals through the upper insulating layer. According to the invention, a flexibility of the semiconductor device is improved and semiconductor devices having different sizes of semiconductor chips can be produced economically.

In the above invention, connecting portions between the terminals and the pattern layer are plated with electrically conductive metal.

In the above invention, the outer terminal portion can be prepared by the steps of applying a resist on one or both surface of a electrically conductive metal plate, forming the terminal portions divided in series through thin portions by a half-etching process on the one or both surfaces of the electrically conductive metal plate, and removing the resist. In the above invention, the outer terminal portion which protrudes from both surface can be formed by punching. Also, in the above invention, a frame terminal and the pole terminals can be formed in a protruding shape by a metal plate being compressed from both surfaces thereof, the frame terminal and pole terminals being arranged in series through the thin portions. According to the invention, the frame terminals and the pole terminals which protrude from both surfaces can be formed easily.

In the above invention, the pattern portion can be prepared by the steps of forming an opening portion through which the connecting portion is exposed in the insulating film, laminating a metal foil on the insulating film, forming the connecting portions and the terminal connecting portions by photo etching. Also, in the above invention, the pattern portion can be prepared by the steps of forming an opening portion by die-cutting through which the connecting portions are exposed in the insulating film, laminating a metal foil on an insulating film, and forming the connecting portions and the terminal connecting portions by photo etching. Further, In the above invention, a whole surface of the metal plate can be plated after the opening portion is formed. Further, in the above invention, the connecting portions can be plated with metal suitable for wire bonding. Further, in the above invention, the outer terminal portion can be connected to the pattern portion through an insulating adhesive. Further, In the above invention, the outer terminal portion is prepared by the steps of, preparing two electrical conductive metal plates, forming recess portions for forming the thin portions through which the frame terminal and the pole terminals are connected at least in one surface of the two electrical conductive metal plates by half-etching, laminating the two metal plates, forming protruding portions to be the frame terminals and pole terminals, the protruding portions protruding from at least one side of the laminated two electrically conductive metal plates. Further, the above invention, can further include the steps of, preparing a metal frame to be the frame terminals and metal balls to be the pole terminals, fixing the metal frames and the metal balls into grooves and recess portions of an electrically conductive metal plate which is formed by etching. According to the invention, a flexible semiconductor device which can cope with various sizes of the semiconductor chips can be produced economically.

The above object of the present invention is achieved by a semiconductor device comprising, a semiconductor chip having a prescribed number of pads provided thereon, a resin portion for sealing the semiconductor chip, a terminal portion in which a prescribed number of pole terminals are electrically connected to the pads provided on the semiconductor chip, the pole terminals being exposed from the resin portion, and a mechanism for preventing separation for preventing the pole terminals from being separated from the resin portion. In the above invention, the mechanism for preventing separation comprises the pole terminals whose section can be a reel shape, a trapezoid shape or a wavy shape. In the above invention, the mechanism for preventing separation can be realized by the pole terminals whose surfaces are rough. Also, in the above invention, the mechanism for preventing separation can be realized by the pole terminals in which metal particles constituting a surface thereof is rough. According to the invention, since the mechanism for preventing separation is provided in the semiconductor device, the pole terminals are prevented from being separated from the resin portion. Accordingly, a reliability of the semiconductor device can be improved.

In the above invention, each of the pole terminals can be made of at least two metals laminated together. Also, in the above invention, each of the pole terminals can have a triple-layer structure in which an inner layer and outer layers provided on both surface of the inner layer, the outer layer having smaller etching rate than the inner layers. According to the invention, a strength of the pole terminals can be improved. Also, a uniform height of the pole terminals can be realized.

In the above invention, the inner layer can be made of material selected from the group consisting of copper and copper alloy, and the outer layers can be made of material selected from the group consisting of iron-nickel alloy, nickel, nickel alloy, iron and iron alloy.

In the above invention, a height of each of the pole terminals can be smaller than a thickness of the resin portion, the semiconductor device can further including solder bumps provided in recess portions formed by the resin portion and the pole terminals. According to the invention, since a height of the pole terminals is less than a thickness of the resin portion and the solder bumps are provided in the recess portions formed by the resin portion and pole terminals, the semiconductor device having a bump structure can be produced easily.

The above object of the present invention is achieved by a method for producing a semiconductor device, comprising the steps of, preparing an outer terminal portion, the outer terminal portion being prepared by the steps of forming etching portions in a metal plate by one or both surfaces of the metal plate on which a resist is applied at a position corresponding to a position at which terminals are formed being half-etched, forming the terminals which are connected to each other via thin plate portions, filling etching portions with resin, mounting a semiconductor chip on a surface of the outer terminal portion in which the resin is filled, sealing the semiconductor chip with a resin, and removing the thin plate portions to separate the terminals, wherein the etching portion is formed so as that the etching portion is over hung. According to the invention, since the half-etching process is conducted so that the etching portion is overhung horizontally, the semiconductor device can be produced easily.

In the above invention, the metal plate can be made of material selected from the group consisting of copper and copper alloy, and the resist can be made of material selected from the group consisting of iron-nickel alloy, nickel, nickel alloy, iron and iron alloy. According to the invention, an overhanging of the etching portion can be realized easily and uniform height of the pole terminals can be realized.

In the above invention, the etching process for half-etching the thin plate portion can be conducted by using an etching liquid for etching only copper alloy. According to the invention, by using the etching liquid which etches only the copper alloy for removing the thin plate portion, the resist can be prevented from being removed with the thin plate portion and an etching of the pole terminal portion can be prevented securely.

The above object of the present invention is achieved by a semiconductor device comprising, a semiconductor chip, a resin sealing the semiconductor chip, and pole terminals provided close around the semiconductor chip, the pole terminals extending vertically, each of the pole terminals having one end, and the one ends thereof being connected to the semiconductor device, the semiconductor chip except a bottom face being sealed by the resin, the pole terminals except connecting portions to the semiconductor chip being sealed by the resin. In the above invention, each of the pole terminals can be electrically connected to the semiconductor chip directly via wires. According to the invention, the pole terminals provided close around the semiconductor chip extend vertically and one ends thereof are connected to the semiconductor device. Accordingly, no substrates to connect the semiconductor chip and the pole terminals are required in the semiconductor device. Therefore, the semiconductor device of a simple structure, with low-cost and low height, can be realized. Also, since the pole terminals provided close around the semiconductor chip extend vertically, an area required for connection thereof can be reduced compared to a semiconductor device in which leads extend horizontally (i.e. QFP-type semiconductor device). Accordingly, a density of connection can be improved.

In the above invention, the pole terminals can be plated at least at portions where the wires are connected. According to the invention, the wires and the pole terminals can be electrically connected securely.

The above object of the present invention is achieved by a method for producing a semiconductor device, comprising the steps of, preparing an outer terminal portion, the outer terminal portion being prepared by the steps of, forming a frame portion and pole terminals by one or both surfaces of a metal plate being half-etched, the frame portion and pole terminals being connected to each other via thin plate portions, mounting a semiconductor chip on the thin plate portion, connecting the semiconductor chip to the terminals, sealing the semiconductor chip and the outer terminal portions on the semiconductor side with a resin, and etching an opposite surface of the outer terminal portion to the semiconductor mounting surface for removing the thin plate portions to separate the frame portion and pole terminals, and removing the frame portion. According to the invention, since the half-etching process can be conducted easily and most of the steps of the method can be conducted by the existing facilities used in the conventional method. Therefore, the semiconductor device can be produced easily and economically.

In the above invention, the pole terminals are plated at least at portions where the wires are connected. According to the invention, the wires and the pole terminals can be electrically connected securely.

In the above invention, a plurality of the outer terminal portions can be made from the metal plate whereby a plurality of semiconductor device are produced at the same time. According to the invention, the semiconductor device can be produced efficiently.

In the above invention, the resin can be molded in a mold, a periphery of a cavity of the mold being positioned in the groove etched between the frame portion and the pole terminals, the resin being molded into the cavity when the mold cramp the frame portion. According to the invention, since a thickness of the resin is made small, frame portions can be divided easily. Also, when the mold cramps the frame, the resin is molded. Therefore, positioning error between the mold and the outer terminal can be prevented.

In the above invention, the semiconductor chip can be mounted on the thin plate portion via a pad material and the pad material can be removed with the thin plate portion to expose the bottom surface of the semiconductor chip. According to the invention, the semiconductor chip is mounted on the thin portion securely. Also, since the pad material is removed with the thin plate portion, a bottom of the semiconductor is exposed from the resin portion. Accordingly, the semiconductor chip can be made thinner and heat release characteristics of the semiconductor chip can be improved.

In the above invention, non-electrolytic plating is formed in an exposing portion of the pole terminals. According to the invention, the pole terminals can be protected and can be solder-jointed easily.

The above invention can further include the step of dipping the pole terminals into a solder bath whereby the plating is absorbed by the solder bath. According to the invention, a solder coating to the pole terminals and removing the plating remaining in the pole terminals are conducted at the same time by dipping the pole terminal in the solder bath after the frame is removed.

Other objects and further features of the present invention will be apparent from the following detailed description when read in conjunction with the accompanying drawings.

BRIEF DESCRIPTION OF THE DRAWINGS

FIG. 5 is a flowchart showing a method for producing an outer terminal portion shown in FIG. 2;

FIGS. 12A and 12B are schematic illustrations showing a final step of the method for producing a semiconductor device;

FIG. 15A is a perspective view showing a semiconductor device of a second embodiment;

FIG. 15B is a sectional view showing the semiconductor device of the second embodiment;

DESCRIPTION OF THE PREFERRED EMBODIMENTS

The preferred embodiments of the present invention will now be described in further detail with reference to the accompanying drawings.

Figure 2A:
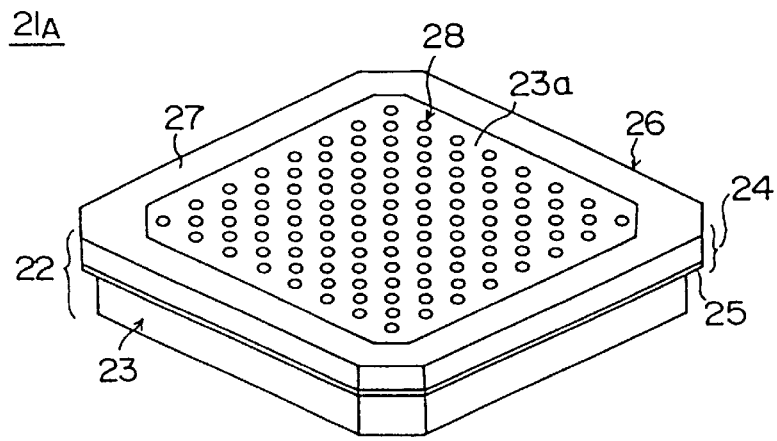
FIG. 2A is a perspective view showing a semiconductor device of a first embodiment.
Figure 2B:
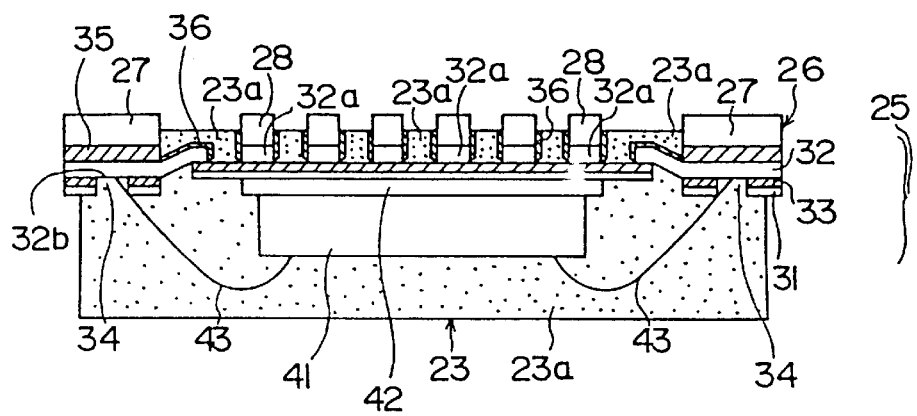
FIG. 2B is a sectional view the semiconductor device of the first embodiment.

FIGS. 2A and 2B are schematic illustrations showing a first embodiment of the present invention, in which FIG. 2A is a perspective view showing a bottom surface of a semiconductor device of the first embodiment and FIG. 2B is a sectional view thereof.

A semiconductor device 21A shown in FIGS. 2A and 2B comprises a resin portion 23 in which a package 22 is molded and a terminal portion 24. The terminal portion 24 comprises a pattern portion 25 formed by a flexible PWB (Print Wiring Board) and an outer terminal portion 26.

The outer terminal portion 26 is made of a conductive metal, such as copper. In a periphery of the outer terminal 26, a frame terminal 27 is formed. Inside of the frame terminal 27, a prescribed number (for example, 324) of pole terminals 28 which are insulated by a resin 23a respectively are arranged in a lattice formation. The frame terminal 27 functions as a base when wire bonding to be described later is conducted. Also, the frame terminal 27 functions as a power supply pattern or a grounding pattern to improve anti-noise characteristics, as will be described later.

As shown in FIG. 2B, the pattern portion 25 comprises a base layer 31 of an insulating film or metal frame, a pattern layer 32 made of, for example, a copper foil and an insulating layer 33 of an epoxy resin arranged between them. In a center of the base layer 31, a semiconductor chip 41 is mounted through an adhesive 42 of, for example, a silver paste. In the pattern layer 32, terminal connecting portions 32a and wire connecting portions 32b are formed respectively corresponding to the pole terminals 28.

In the base layer 31, opening portions 34 through which the wire connecting portions 32b are exposed are formed around the semiconductor chip 41. Pads provided in a periphery of the semiconductor chip 41 are connected to the wire connecting portions 32b through wires 43, as will be described later referring to FIGS. 3A and 3B.

The pattern layer 32 of the pattern portion 25 and the outer terminal portion 26 (frame terminal 27) are bonded through an insulating layer 35 of an epoxy adhesive or an insulating film. In this case, the terminal connecting portions 32a of the pattern layer 32 are electrically connected to the pole terminals 28 of the outer terminal portion 26 through plating layer 36. An exposed surface of the frame terminal 27 and the pole terminal 28 is plated, as will be described later.

Figure 3A:
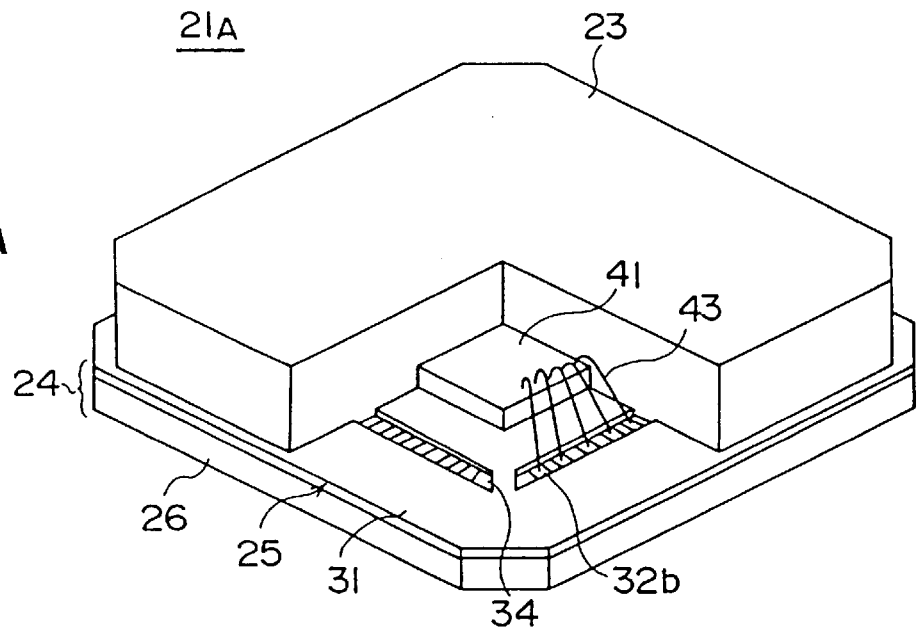
FIG. 3A is a perspective broken view showing the semiconductor device of the first embodiment.
Figure 3B:
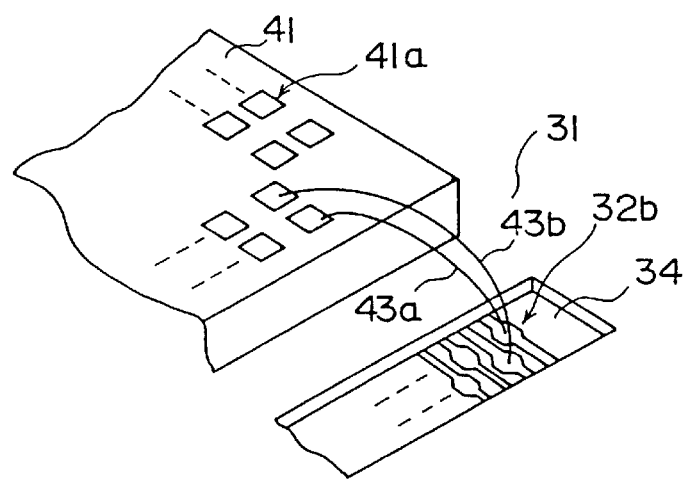
FIG. 3B is an enlarged perspective view showing wire-bondings.

FIG. 3A is a perspective broken view showing the semiconductor device of the first embodiment and FIG. 3B is an enlarged view of wire bonding.

As shown in FIG. 3A, the semiconductor chip 41 is mounted in the center of the base layer 31, and the wire connecting portions 32b of the pattern layer 32 exposed through the opening portions 34 are electrically connected to the semiconductor chip 41 through the wires 43, as described above in FIG. 2.

As shown in FIG. 3B, pads 41a are arranged on the semiconductor chip 41 in two lines along the opening portions 34 of the base layer 31. The wire connecting portions 32b of the pattern layer 32 exposed from the opening portions 34 are arranged in a staggered formation for the wire bonding.

The pads arranged close to the opening portions 34 are connected to the wire connecting portions 32b arranged close to the semiconductor chip 41 through the wires 43a. The pads apart from the opening portions 34 are electrically connected to the wire connecting portions 32b apart from the semiconductor chip 41 through the wires 43b forming arcs of a larger radius than that of the wires 43a. According to the structure thereof, a contact between the wires 43a, 43b is prevented and a wiring density can be improved.

Figure 4A:
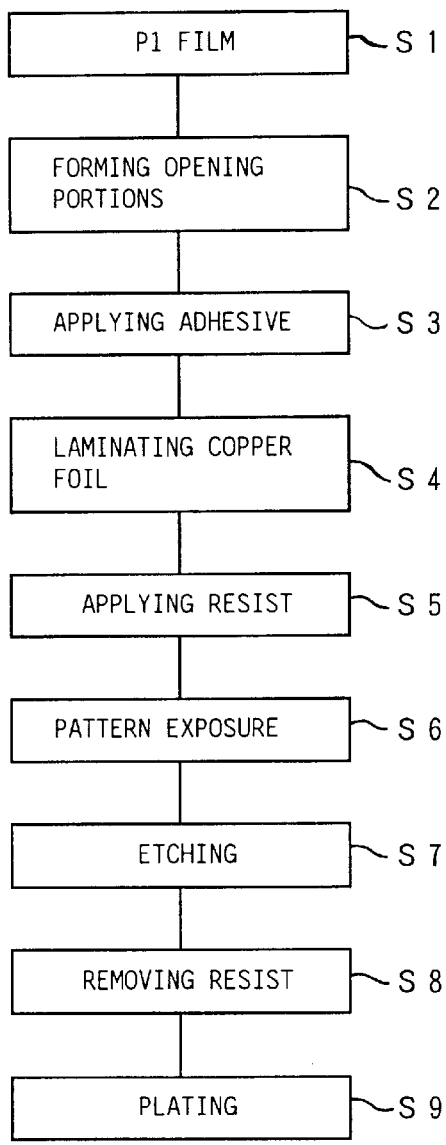
FIG. 4A is a flowchart showing a method for producing a pattern portion shown in FIG. 2 in which a base thereof is an insulating film.
Figure 4B:
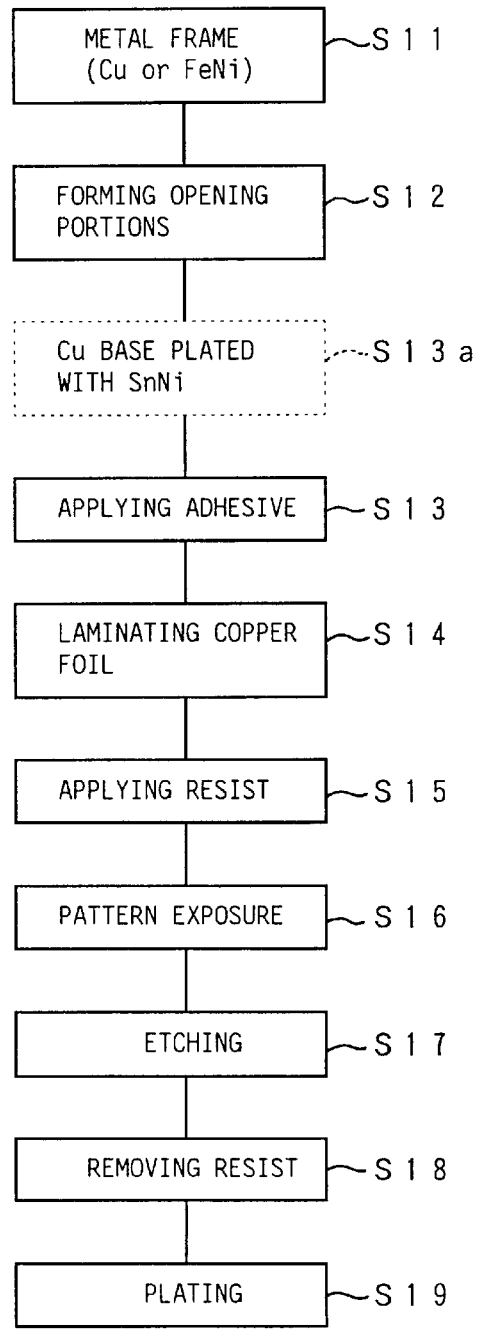
FIG. 4B is a flowchart showing a method for producing a pattern portion shown in FIG. 2 in which the base thereof is a metal member.

FIGS. 4A and 4B are flowcharts showing processes for producing the pattern portion 25 shown in FIG. 2. FIG. 4A shows a process for producing the pattern portion in which a base thereof is an insulating film and FIG. 4B shows a process for producing the pattern portion in which the base thereof is a metal (i.e. copper or tin/nickel alloy) frame.

In FIG. 4A, at first, a polyimide (PI) film to be the base layer 31 is prepared (Step S1). The PI film is punched in order to form the opening portions 34 to expose the wire connecting portions 32b (Step S2). After an epoxy insulating adhesive to be the insulating layer 33 is applied on the PI film (Step S3), a copper foil to be the pattern layer 32 is laminated on the adhesive (Step S4). Next, after a resist is applied on the copper foil (Step S5), a prescribed pattern is exposed (Step S6). After the exposure, as an etching process, a chemical grinding is conducted on the exposed surface (Step S7). After that, the resist applied is removed (Step S8). Through the above steps, the wire connecting portions 32b are exposed through the opening portions 34 of the base layer 31. After that, a plating (gold, silver or palladium) for the wire bonding is conducted on the wire connecting portions 32b (Step S9).

On the other hand, when the base layer 31 is a metal frame, a metal frame of copper or iron/nickel is prepared (Step S11), as shown in FIG. 4B. The opening portions 34 for exposing the wire connection portions 32b are formed by a punching or an etching process (Step S12). After that, when the base is a copper, the base is plated with SnNi (Step S13a). After the opening portions 34 are formed or the base layer 31 is plated with SnNi, an insulating epoxy adhesive to be the insulating layer 33 is applied on the base layer 31 (Step S13). On the insulating epoxy layer, a copper foil to be the pattern layer 32 is laminated (Step S14). On the copper foil, a resist is applied according to the prescribed pattern (Step S15). The copper foil is exposed in order to form the pattern (Step S16). After the exposure, an etching process is conducted on the exposed surface (Step S17). After that, the resist is removed (Step S18). The wire connecting portions 32b exposed through the opening portion 34 of the base layer 31 are plated with gold, silver or palladium for the wire bonding (Step S19).

FIG. 5 is a flowchart showing a process for producing the outer terminal portion 26 shown in FIG. 2. FIG. 5 shows a process in which the outer terminal is formed by an etching process. In FIG. 5, a copper plate is prepared (Step S21). A resist is applied on a contacting surface to the pattern portion 25 of the copper plate according to the pattern in which the frame terminal 27 and the pole terminals 28 are formed (Step S22). A resist is applied to an opposite surface to the contacting surface to the pattern portion of the copper plate (Step S23). After both surfaces are etched (Step S24), the resist on both surfaces is removed (Step S25). In this case, the contacting surface to the pattern portion is half-etched, and the frame terminal 27 is connected to the pole terminals 28 through thin plate portions.

Figure 6A:
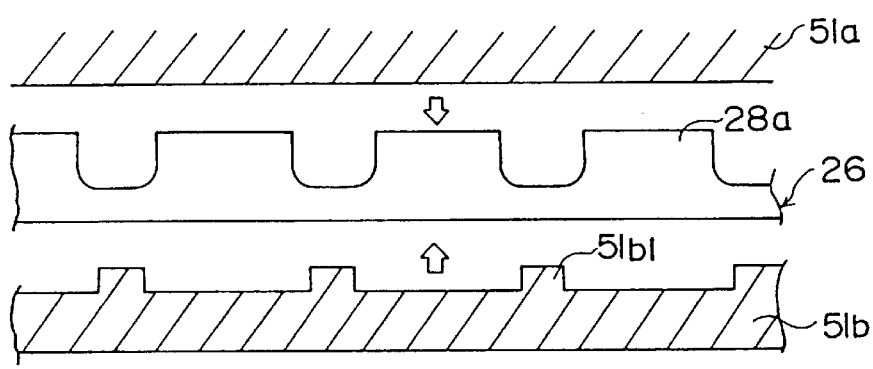
FIGS. 6A and 6B are schematic illustrations showing a post treatment to the outer terminal shown in FIG. 5.
Figure 6B:
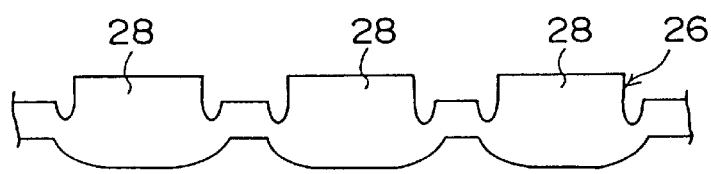
Figure 7A:
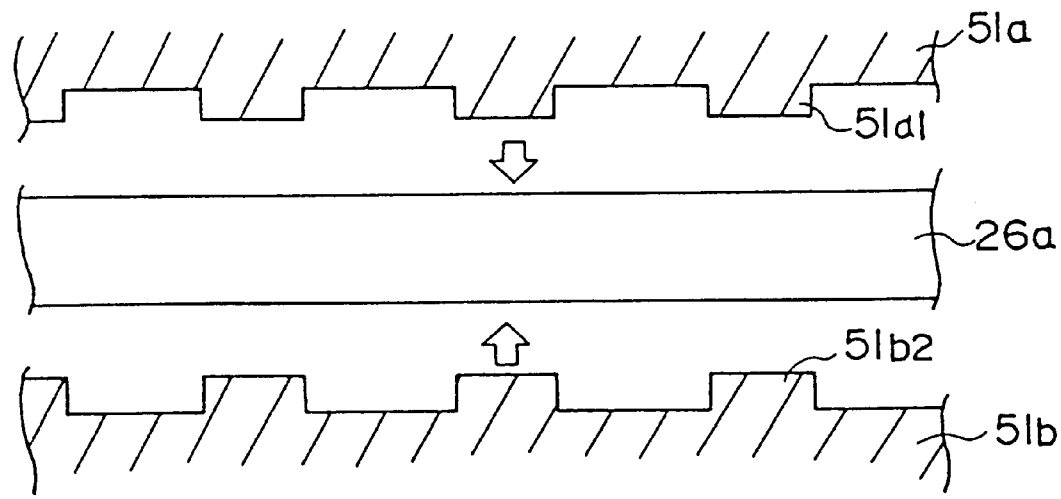
FIGS. 7A and 7B are schematic illustrations showing a method for producing a variation of the outer terminal.
Figure 7B:
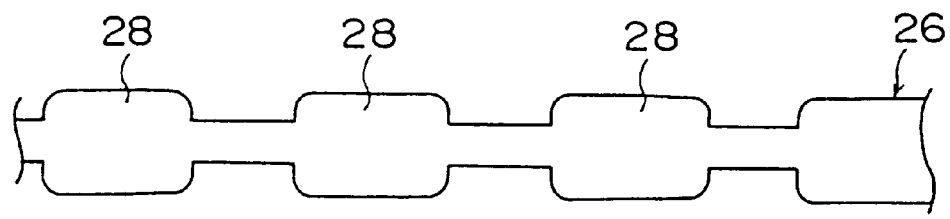

FIGS. 6A and 6B are schematic illustrations showing a post-treatment to the outer terminal portion 26. FIGS. 7A and 7B are schematic illustrations showing a method for producing a variation of the outer terminal 26.

As shown in FIG. 6A, in the outer terminal 26 formed by the process shown in FIG. 5, projections 28a to be pole terminals 28 are formed in the contacting surface to the pattern portion. An opposite surface is a flat plate which is not etched.

The outer terminal portion 26 is placed in a press 51 comprising a punch 51a and a die 51b. In this case, the contacting surface to the pattern portion faces the flat punch 51a and the opposite surface thereof faces the die 51 in which projection $51b_1$ corresponding to the recess portions between the projections 28 are provided. As shown in FIG. 6B, the pole terminal 28 is formed to protrude from the opposite surface by the stamping of the press 51.

In FIG. 7A, the outer terminal 26 in which the projections 28a are formed as shown in FIG. 6A is not used. In this case, a copper plate 26a is placed between the punch 51a and the die 51b, in which projections $51a_1$ formed in the punch 51a and projections $51b_2$ formed in the die 51b face each other. As shown in FIG. 7B, the outer terminal 26 having the pole terminals 28 protruding from both surfaces thereof is formed by stamping of the press 51. In this case, either surface can be used as a contacting surface to the pattern portion.

Figure 8A:
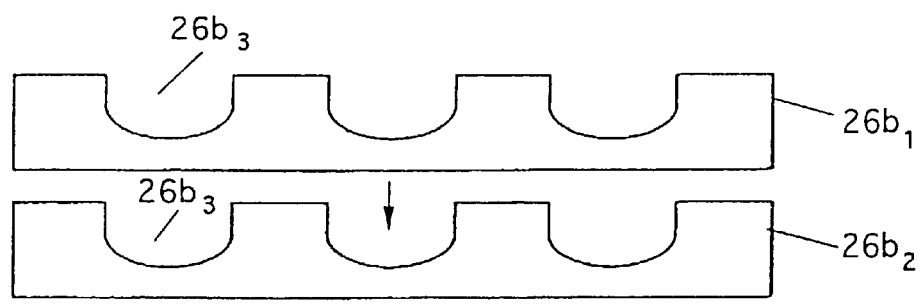
FIGS. 8A and 8B are schematic illustrations showing a method for producing another variation of the outer terminal.
Figure 8B:
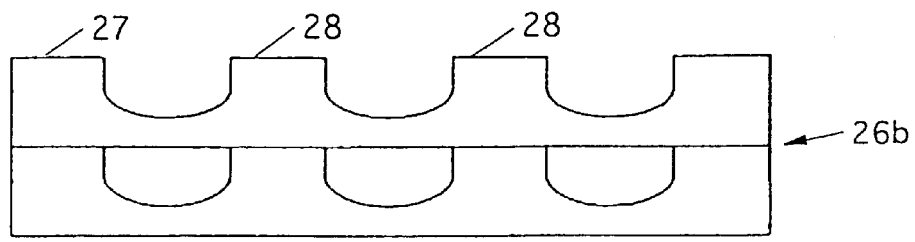
Figure 9A:
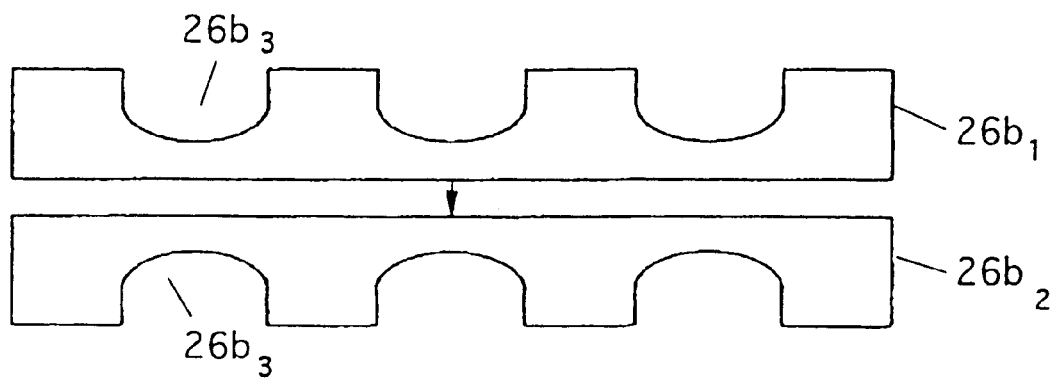
FIGS. 9A and 9B are schematic illustrations showing a method for producing another variation of the outer terminal.
Figure 9B:
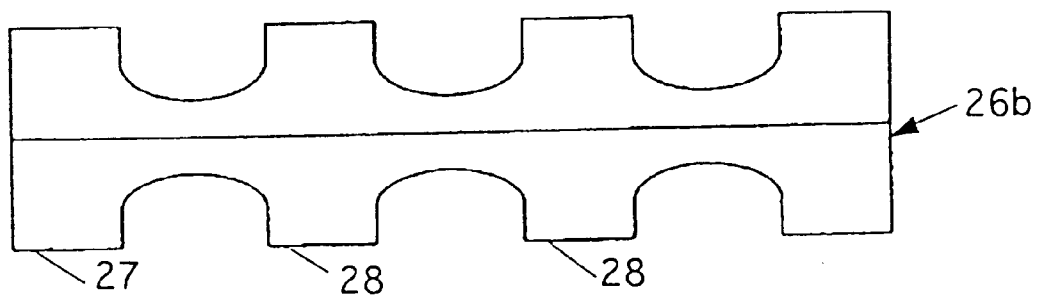
Figure 10A:
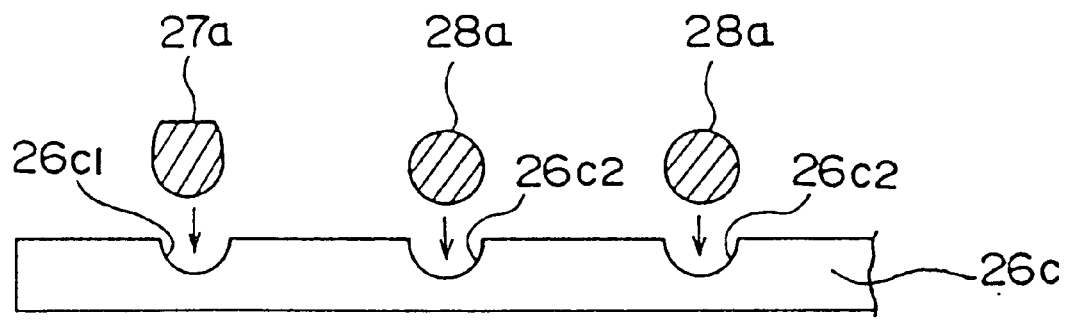
FIGS. 10A and 10B are schematic illustrations showing a method for producing another variation of the outer terminal.
Figure 10B:
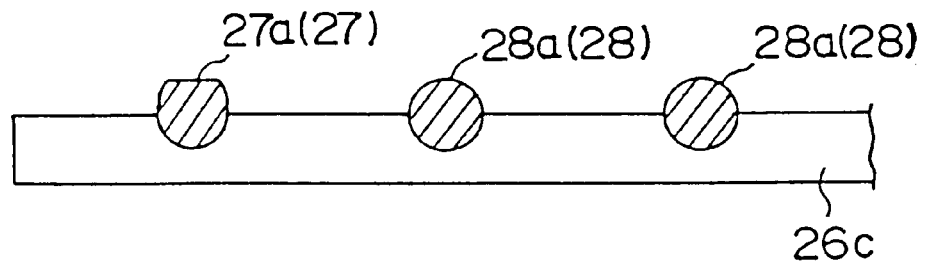

FIGS. 8–10 show methods for producing varieties of the outer terminal portion shown in FIG. 5.

FIG. 8A shows two conductive metal plates $26b_1$, $26b_2$ (i.e. copper alloy) in which a prescribed number of recesses $26b_3$ are prepared. The conductive metal plate $26b_1$ is laminated on the conductive metal plate $26b_2$ so as that a surface of the conductive metal plate $26b_1$ in which the recesses $26b_3$ are not formed faces a surface of the conductive metal plate $26b_2$ in which the recess $26b_3$ are formed, as shown in FIG. 8B. These two conductive metal plates $26b_1$, $26b_2$ are bonded together by ultrasonic machining in order to form the outer terminal 26. The outer terminal 26 in which the frame terminal 27 is connected to the pole terminals 28 through thin portions, as will be described later in FIG. 12B, is formed by, after the exposed surface on which the recesses $26b_3$ are not formed are sealed by resin, the surface being etched.

Also, as shown in FIG. 9A, two conductive metal plates $26b_1$, $26b_2$ shown in FIG. 8A are bonded by an ultrasonic machining in a manner in which the surfaces in which the recesses $26b_3$ are not formed are facing each other. The pole terminals 27 formed in the frame terminal 28 are arranged in series through the thin plate portions on both surfaces of the outer terminal portion 26. In this case, both surfaces can be used as the pattern portion connecting surface.

In FIG. 10A, metal wire frame 27a of a ring structure made of solder or tin, which is equivalent to the frame terminals 27 in thickness, is prepared. The metal wire frame 27a will be the frame terminal 27 later. Also, metal balls 28a, which are equivalent to the pole terminals 28 in thickness, made of solder or tin, are prepared. The metal balls will be pole terminals 28 later. Further, a metal plate 26c, which is a metal plate of copper alloy in which a groove $26c_1$ (which corresponds to the metal wire frame 27a) and recess portions $26c_2$ (which correspond to the metal balls 28a) are formed therein is prepared. After the metal wire frame 27a is inserted into the groove $26c_1$ and the metal balls 28a are inserted into the recess portions $26c_2$, these elements are heated to be jointed. That is, the frame terminal portion 27 of the metal wire frame 27a and the pole terminals 28 of the metal balls 28a are formed in series through thin portions. After a surface of the outer terminal 26 on which the metal wire frame 27a and the metal balls 28a are not provided is exposed and sealed by a resin, an etching process for removing the metal conductive plate 26c completely is conducted in order to form the frame terminal 27 and the pole terminals 28, which are connected each other through thin portions, as will be described later with reference to FIG. 12B.

Figure 11:
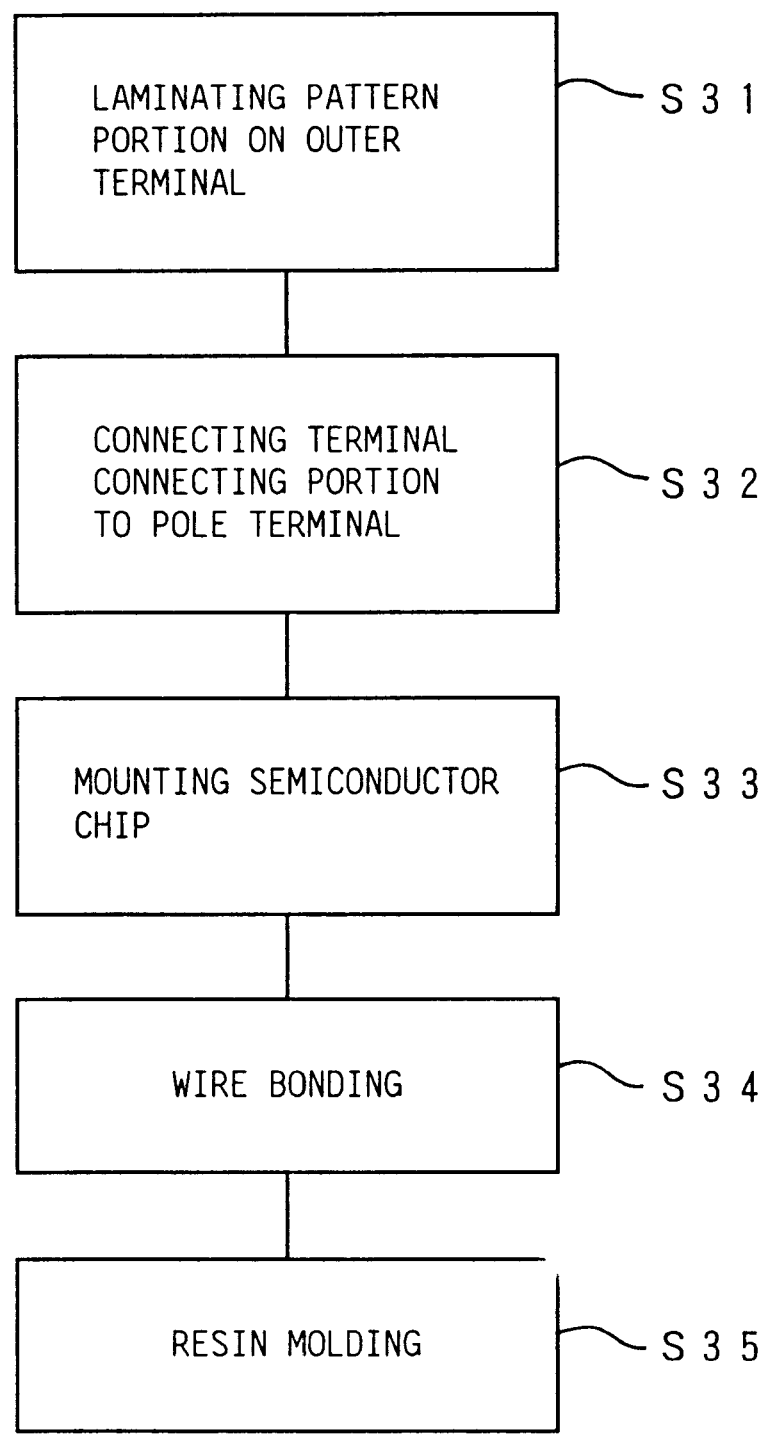
FIG. 11 is a flowchart describing a method for chip bonding in the first embodiment.

FIG. 11 is a flowchart describing a method for bonding the semiconductor chip in the first embodiment. In FIG. 11, the pattern portion 25 is attached to the outer terminal portion 26 through an adhesive (i.e. thermosetting epoxy resin) or insulating film which will be an insulating layer 35 in a manner that the terminal connecting portions 32a face the corresponding pole terminals 28 (Step S31). After that, the outer terminal 26 is plated with copper to form a plating layer 36, which electrically connects the terminal connecting portions 32a to the pole terminals 28 (Step S32). After the semiconductor chip 41 is mounted on the pattern portion 25 through the adhesive 42 (Step S33), the pads 41a on the semiconductor chip 41 are bonded to the wire connecting portions 32b exposing from the opening portions 34 through the wires 43a, 43b (Step S34, Cf. FIG. 3B). After the frame terminal 27 and the pole terminals 28 of the outer terminal 26 are exposed, the semiconductor chip side is molded by the resin 23a to form the resin portion 23 (Step S35), as shown in FIG. 12A.

FIGS. 12A and 12B are schematic illustrations showing a final step of producing the semiconductor device of the first embodiment. FIG. 12A shows the semiconductor device formed through the steps shown in FIG. 8.

In this step, the frame terminal 27 is still electrically connected to the pole terminals 28 in the outer terminal portion 26. In order to separate the frame terminal 27 from each of the pole terminals 28, an exposed surface of the outer terminal 26 is etched to a surface of the resin 23a. The separated frame terminal 27 and the pole terminals 28 are plated with gold, silver, tin or palladium. When the pattern portion 25 and the outer terminal portion 26 are formed in series, each semiconductor device $21_A$ can be separated after various steps such as the packaging, the etching and the plating are done.

According to the semiconductor device of this embodiment, the terminal portion 24 is arranged at the bottom side of the semiconductor chip 41, the pole terminals 28 are arranged at the bottom of the semiconductor chip 41 and an electrical connection between the terminal portion 24 and the semiconductor chip 41 is achieved by using the wires 43a, 43b instead of the TAB techniques. Accordingly, a size of the semiconductor chip 41 or a layout of the pads is not limited and the package structure can be made flexible. Also, the outer terminals (pole terminals 28) can be formed after all terminals which are still electrically connected to each other are sealed by the resin to form the resin portion. Accordingly, the production of the outer terminal can be conducted easily and economically, and the resin can be used for the protection of the semiconductor chip 41. Furthers the frame terminal 27 is provided in the outer terminal portion 26. The frame terminal 27 functions as a base for grounding or as a terminal for connecting power source or grounding. According to the feature, a number of terminals for an electrical source and a grounding can be reduced. Also, anti-noise characteristics can be improved.

Figure 13A:
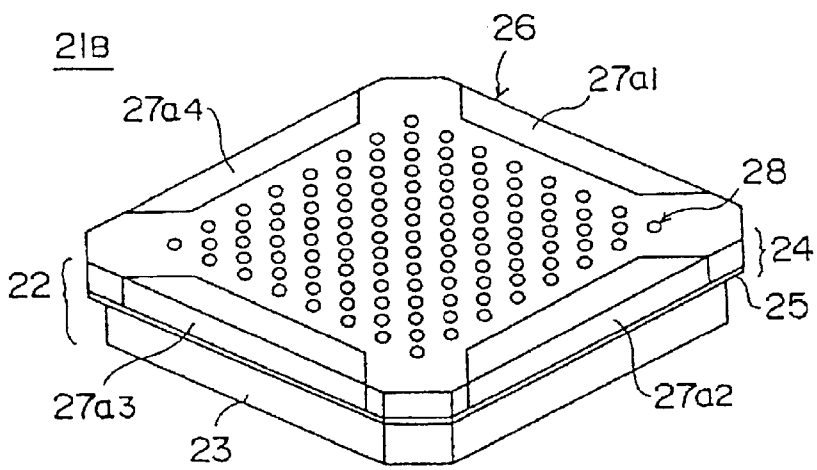
FIGS. 13A, 13B and 13C are schematic illustrations showing variations of a package structure of the first embodiment.
Figure 13B:
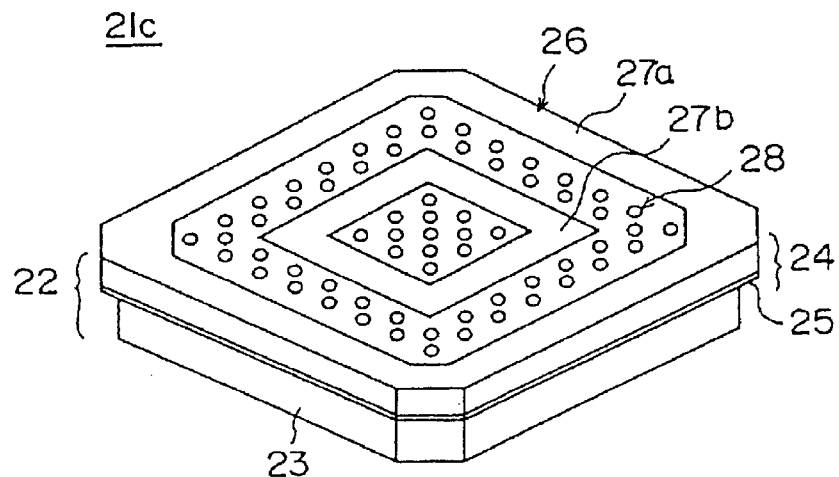
Figure 13C:
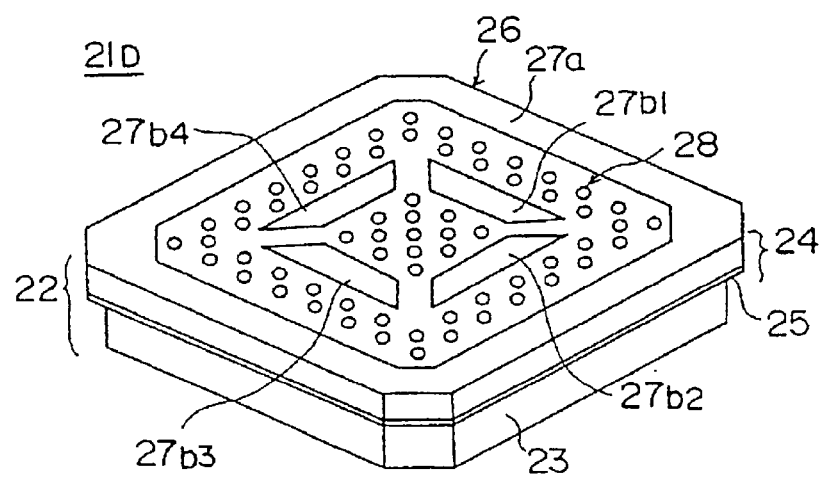

FIGS. 13A, 13B and 13C are perspective views showing variations of the package of the first embodiment.

In the semiconductor device 21B shown in FIG. 13A, separate frame portions $27a_1$–$27a_4$ are provided in the periphery of the outer terminal 26. Another features are the same as those shown in FIG. 2. By dividing the frame terminal into a plurality of (in this case, four) parts $27a_1$–$27a_4$, each of the frame terminals $27a_1$–$27a_4$ has a different role, for example, an power supply terminal, a grounding terminal or a signal terminal.

In a semiconductor 21C shown in FIG. 13B, the frame terminal 27 comprises a first frame terminal 27a provided in the periphery of the outer terminal portion 26 and a second frame terminal 27b formed in a ring-shape inside the first frame terminal 27a. The other portions are the same as those shown in FIG. 2. In this case, the second terminal portion 27b can have one of various roles such as a power supply terminal or a grounding terminal, and anti-noise characteristics can be improved.

In a semiconductor device 21D shown in FIG. 13C, second terminal portions $27a_1$–$27a_4$, which is the second frame terminals 27b shown in FIG. 13B divided into four parts, are provided. According to the semiconductor device 21D, anti-noise characteristics can be improved. Also, a variety of a layout of a power supply terminals or grounding terminals can be available.

Figure 14A:
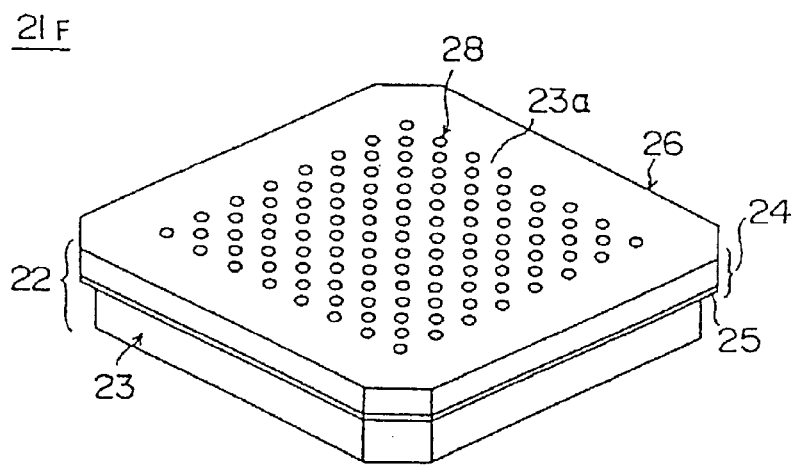
FIGS. 14A and 14B are schematic illustrations showing another variation of the package structure of the first embodiment.
Figure 14B:
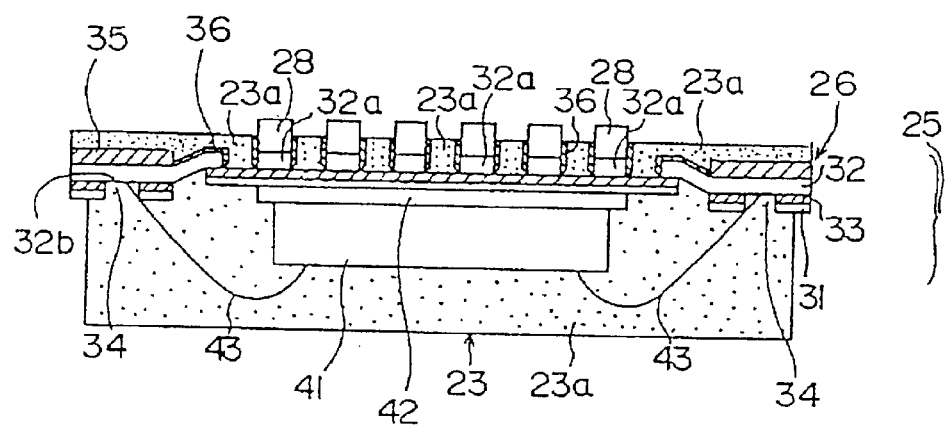

A semiconductor device 21F shown in FIGS. 14A and 14B is characterized in that the frame terminal 27 is removed from the semiconductor device 21A shown in FIG. 2 and the pole terminals 28 are the only terminals provided therein. When a number of the power supply terminals and the grounding terminals is relatively small and an electrical power used therein is small, the semiconductor device 21F having no frame terminal 27 shown in FIG. 14 can be used. The semiconductor device 21F can be decreased in size and can have a greater number of pins.

It goes without saying that features of the semiconductor devices 21B, 21C, 21D shown in FIGS. 13A, 13B and 13C can be combined properly.

FIG. 15A, 15B are schematic illustrations showing a second embodiment of the present invention. FIG. 15A is a perspective view and FIG. 15B is a sectional view. A semiconductor device 21E shown in FIGS. 15A and 15B has a different pattern portion 25 from that of semiconductor device $21_A$ shown in FIG. 2. That is, a pattern portion 25A of the semiconductor device 21E is connected to the outer terminal portion 26 by using a vapor deposition method. In this embodiment, the same features as those previously described in the first embodiment are donated by the same reference numerals and descriptions thereof are omitted.

In the semiconductor device 21E shown in FIGS. 15A and 15B, the package 22 comprises the resin portion 23 and the terminal portion 24 as in the semiconductor device 21A shown in FIG. 2. The resin portion 23 is made of the resin 23a for protecting the semiconductor chip 41.

The terminal portion 24 comprises the pattern portion 25A and the outer terminal 26. The outer terminal portion 26 comprises the frame terminal 27 provided in the periphery thereof and the pole terminals 28 arranged in a lattice formation inside the frame terminal 27. The frame terminal 27 is insulated from the pole terminals 28 by a first insulting layer 51a. A second insulating layer 51b from which the frame terminal 27 and the pole terminals 28 are protruded is applied on the first insulating layer 51a.

On the second insulating layer 51b provided on the frame terminal 27 and the exposed pole terminals 28, a pattern layer 52 is formed by vapor deposition of aluminum. In this case, in the pattern layer 52 above the frame terminal 27, wire connecting portions 52a are formed as shown in FIG. 15B. A connecting portion of the pattern layer 52 to the pole terminals 28 corresponds to the terminal connecting portion 26 of the first embodiment.

On the pattern layer 52, a third insulating layer 53 as an upper insulating layer is formed. In the third insulating layer 53, opening portions 53a are formed at a position corresponding to the wire connecting portions 52a. On the third insulating layer 53, the semiconductor chip 41 is mounted through the adhesive 42. On the semiconductor chip 41, the pads 41a arranged in two lines are formed. The pads 41a are electrically connected to the wire connecting portions 52a through wires 43 (43a, 43b) forming arcs of different radius in order to avoid contact between the wires. Among the pads 41a, for power supply pads are electrically connected to the frame terminal 27 through wires 43. The semiconductor chip 41 is sealed by the resin 23a on the third insulating layer 53 to protect the semiconductor chip 41. The outer terminal 26 can be made by a method similar to that described in FIGS. 5–7.

Figure 16A:
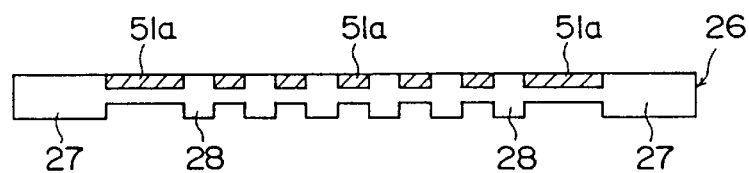
FIGS. 16A, 16B, 16C and 16D are schematic illustrations showing a method for producing a pattern portion of the second embodiment.
Figure 16B:
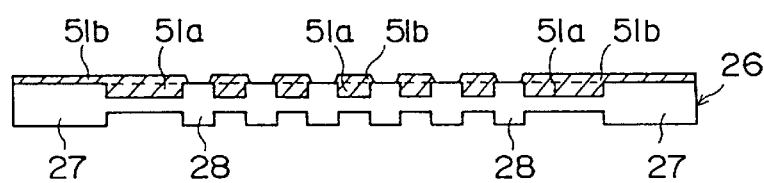

FIG. 16A, 16B, 16C and 16D are schematic illustrations showing a method for producing the pattern layer in the second embodiment. In the outer terminal 26 formed by the method described in FIGS. 5–7, the frame terminal 27 is electrically connected to the pole terminals 28. In recesses between the frame terminal 27 and the pole terminals 28 on one side, a powdered glass, a glass paste or an epoxy resin as the first insulating layer 51a is filled, as shown in FIG. 16A. As shown in FIG. 16B, after the pole terminals 28 are exposed, a glass or a resin the same as those used as the first insulating layer 51a is applied in order to form the second insulating layer 51b.

In FIGS. 16A and 16B, the first insulating layer 51a and the second insulating layer 51b are laminated sequentially. However, a glass melted on the exposed surface of the pole terminals 28 can be the first insulating layer 51a and a silicon oxide (SiOn) coated by a CVD (Chemical Vapor Deposition) method on the exposed surface of the pole terminals 28 can be the second insulating layer 51b. Also, after the first insulating layer 51a is formed by applying a resin on the whole surface and the surfaces of the pole terminals 28 are exposed, the second insulating layer 51*b* can be formed by a printing on the first insulating layer 51*a* except the exposed surfaces thereof.

Figure 16C:
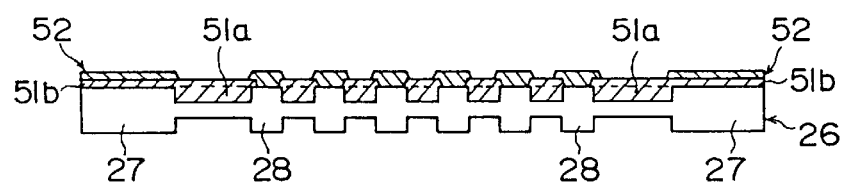
Figure 16D:
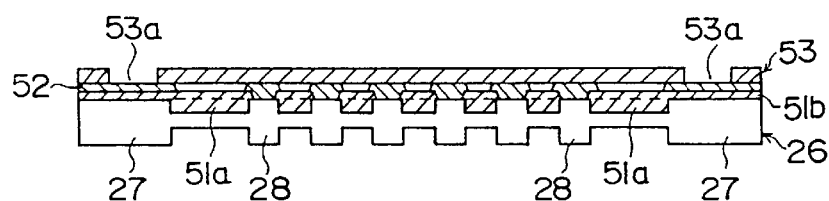

After the exposed surface of the second insulating layer 51*b* and the pole terminals 28 are vapor-deposited by aluminum using a mask of a predetermined pattern, the surface is plated by a metal which is suitable for wire-connection such as gold or palladium in order to form the pattern layer 52 as shown in FIG. 16C. In this case, after aluminum is vapor-deposited and the pattern is formed by a photo-etching process, the above plating can be conducted. Subsequently, an insulating film having opening portions 53, a SiOn layer formed by a CVD method or a printed resin paste can be formed inside the frame terminal 27 as the third insulating layer 53, as shown in FIG. 16D.

Figure 17A:
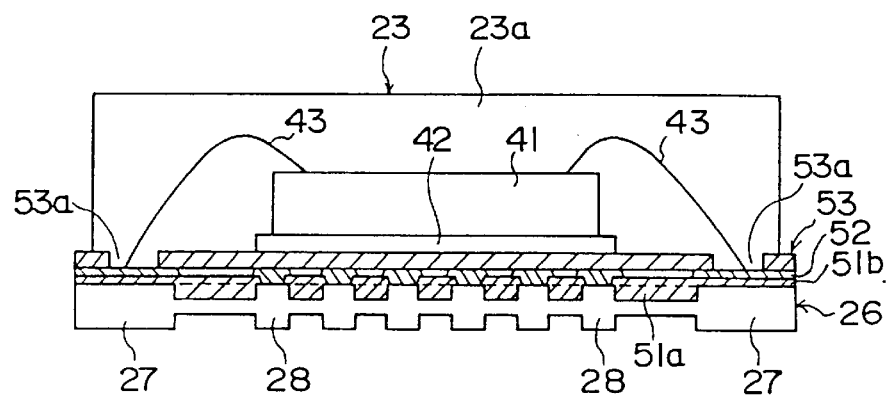
FIGS. 17A and 17B are schematic illustrations showing a final step of the method for producing the semiconductor device of the second embodiment.
Figure 17B:
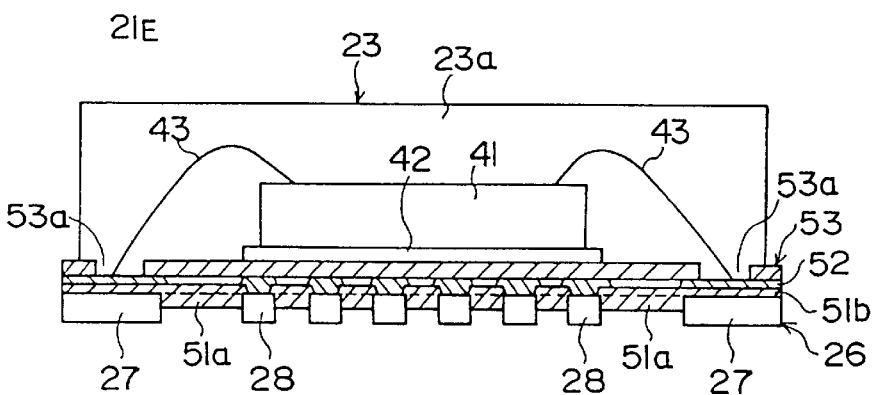

FIGS. 17A, 17B are sectional views showing a final step of producing the second embodiment. In FIG. 17A, the semiconductor chip 41 is mounted on the pattern portion 25 formed by the method described with reference to FIGS. 16A, 16B, 16C and 16D through the adhesive 42 (i.e. silver paste) and the pads 41*a* are electrically connected to the wire connecting portions 52*a* through the wires 43 (43*a*, 43*b*) in the manner shown in FIG. 3A and 3B.

Above the terminal portion 24, the semiconductor chip 41 is sealed by the resin 23*a* in order to form the resin portion 23. Subsequently, a bottom surface of the outer terminal 26 is etched in order to separate each of the pole terminals 28 and the frame terminal 27. The surface of the frame terminal 27 and the pole terminals 28 is plated with solder, gold, silver, tin or palladium to be connected to a substrate.

When the pattern portion 25A and the outer terminal 26 are formed in series, various steps such as packaging, etching and gilding are conducted in series. In the final step, each semiconductor device can be separated. Also, the outer terminal portion 26 can be divided into a plurality of parts at the periphery or inside, as shown in FIGS. 13A, 13B and 13C. In this case, each divided outer terminal can have a different role, such as an power supply terminal or a grounding terminal, and anti-noise characteristics can be improved.

Figure 18A:
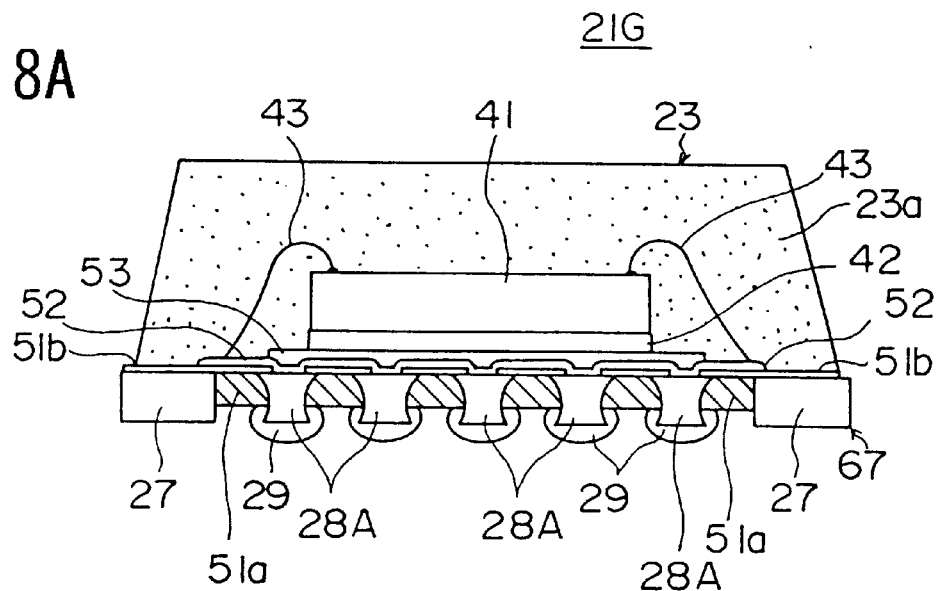
FIG. 18A is a sectional view showing a semiconductor device of a third embodiment.
Figure 18B:
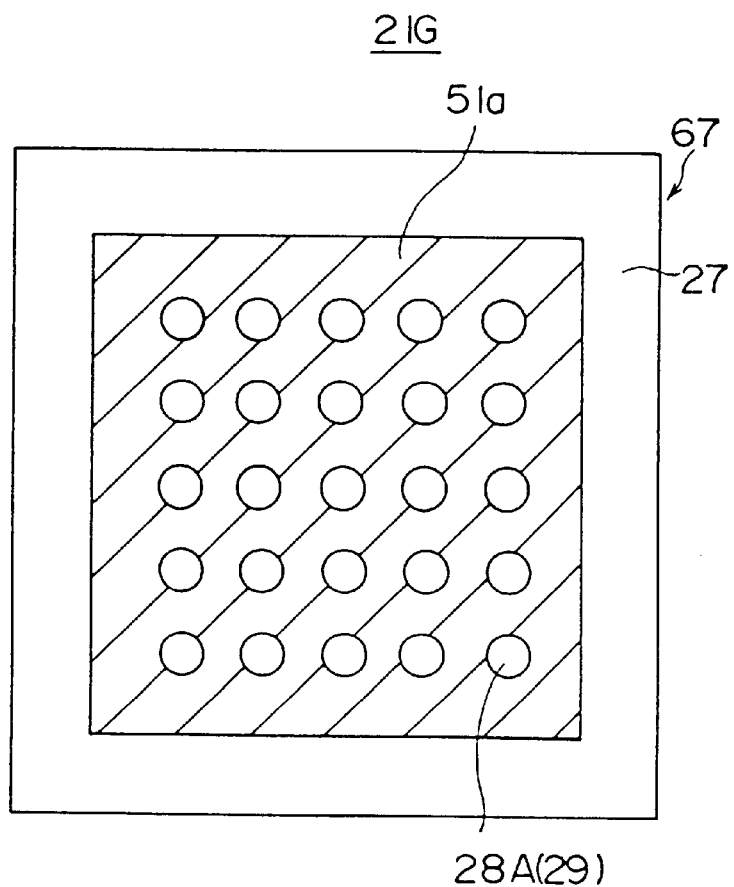
FIG. 18B is a rear view showing the semiconductor device of the third embodiment.

Next, referring to FIGS. 18A and 18B, a semiconductor device 21G of a third embodiment of the present invention will be described. FIG. 18A is a sectional view showing a semiconductor device 21G and FIG. 18B is a rear view thereof. In FIGS. 18A and 18B, the same features as those previously described in the semiconductor device 21E of the second embodiment with reference to FIGS. 15A and 15B are donated by the same reference numerals and descriptions thereof are omitted.

Figure 21A:
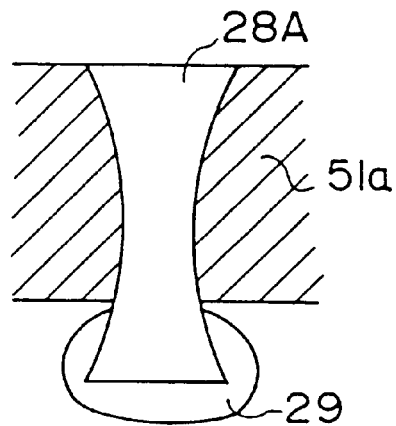
FIGS. 21A, 21B and 21C are schematic illustrations showing variations of a mechanism for preventing separation.

The semiconductor device 21G of this embodiment is characterized in that a mechanism for preventing separation is provided in order to prevent pole terminals 28A from being separated from a first insulating layer 51*a* which constitutes a part of the resin portion 23. In the embodiment shown in FIG. 18A, the mechanism for preventing separation is realized by the pole terminals 28A whose cross-sectional shape is a reel shape. FIG. 21A is an enlarged view showing the pole terminal 28A. As shown in FIG. 21A, by making a cross-sectional shape of the pole terminal 28A a reel shape (cross-sectional area of the central portion being smaller than that of either end), the pole terminals 28A have an anchor effect to the first insulating layer 51*a*, and the pole terminals 28A are securely prevented from being separated from the first insulating layer 51*a*. Since the pole terminals 28A are prevented from being separated from the first insulating layer 51*a* as described above, the reliability of the semiconductor device 21G can be improved. A reference numeral 29 in FIG. 21A refers to a solder formed in the pole terminal 28A.

Next, a method for producing the semiconductor device 21G is described referring to the FIGS. 19A, 19B and 19C and FIGS. 20A, 20B and 20C.

The pole terminals 28A shown in FIGS. 18A and 18B are made of one metal member. However, a method for producing a pole terminal having a triple-layer structure in which two different metals are used is described hereinafter.

In order to produce the semiconductor device 21G, a metal plate (hereinafter, referred to as a clad metal 60) shown in FIG. 18A is prepared. The clad metal 60 will be the pole terminals 28A and frame terminal 27. The clad metal 60 is a triple-layer member comprising an inner layer portion 61 of a metal plate and outer layer portions 62, 63 laminated on both surfaces of the inner layer portion 60. The outer layer portions 62, 63 are made of a metal having a lower etching rate than the inner layer portion 61. That is, the outer layer portions 62, 63 are not etched easily. Accordingly, the pole terminals 28A and the frame terminal 27 have the triple-layer structure consisting of a pair of outer layer portion 62, 63 and the inner layer portion 61 placed between the outer layer portions 62, 63. As a metal combination of the inner layer portion 61 and the outer layer portions 62, 63, when a copper or a copper alloy is used in the inner layer portion 61, an iron-nickel alloy (i.e. 42 alloy), a nickel alloy, an iron or an iron alloy can be used as the outer layer portions 62, 63.

In the clad metal 60 having the above-mentioned structure, the outer layer portions 62, 63 are patterned. In this step, the clad metal is etched so that outer layer portions 62, 63 remain at positions where the pole terminals 28 are formed (for example, etched by ferric chloride). The outer layer portions 62, 63 remaining in the positions at which the pole terminals 28A are formed function as resists when the inner portion 61 is etched, as described later. As shown in FIG. 18A, when the pole terminal 28A does not have the triple-layer structure, the outer layer portions 62, 63 are replaced by a resist material (i.e. resin), and the patterning process is conducted so as that the resist material remains in the positions at which the pole terminals 28A are formed.

After the patterning to the outer layer portions 62, 63, etching portions 64, 65 are formed in the clad metal 60 by a half-etching process on both sides of the clad metal 60. In this case, since the etching rate of the outer layer portions 62, 63 is lower than that of the inner layer portion 61, that is, the outer layer portions 62, 63 are etched less easily, the outer layer portions 62, 63 are barely etched, but the inner layer portion 60 is very etched. Also, since the clad metal 60 is half-etched on both sides, thin portions 66 are formed in the middle of the inner layer portion 61. In the above-mentioned etching process, by controlling an etching time or by conducting an aeolotropic etching, the inner layer portion 60 is designed to be excessively etched horizontally near the outer layer portions 62, 63. By this process, over-etched portions 64*a*, 65*a* are formed in the etching portions 64, 65.

Figure 19A:
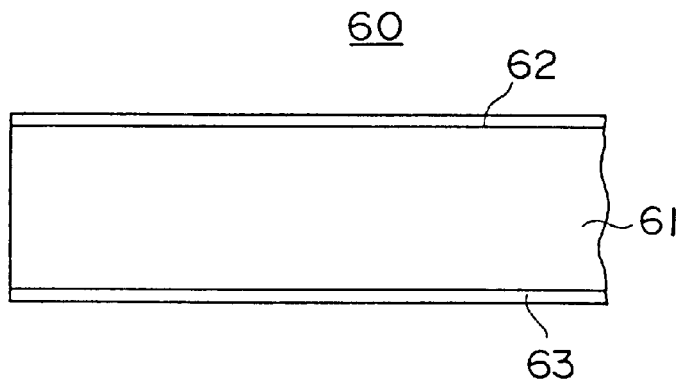
FIGS. 19A, 19B and 19C are schematic illustrations showing a method for producing the semiconductor device of the third embodiment of the present invention.
Figure 19B:
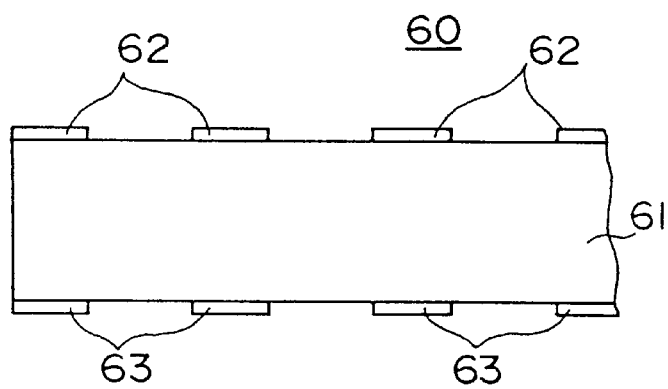
Figure 19C:
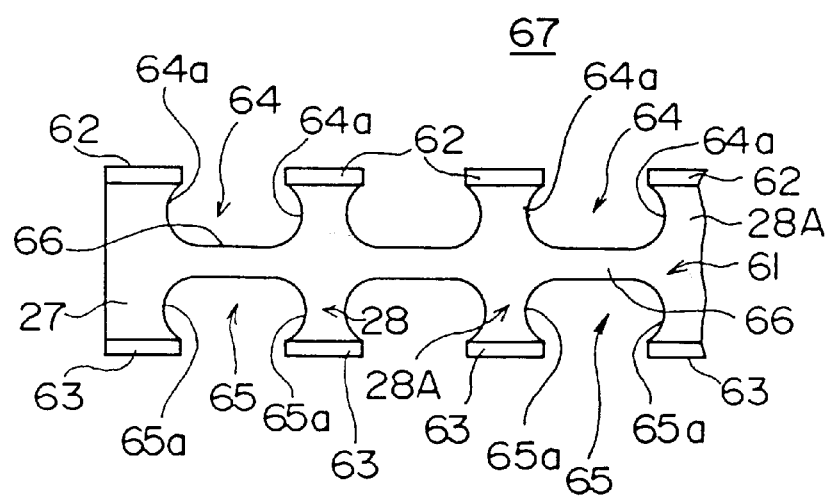

By the above-mentioned processes, an outer terminal portion 67 shown in FIG. 19C is formed. As shown in FIG. 19C, a plurality of the pole terminals 28A are connected to each other and are connected to the frame terminal 27 through the thin portions 66. The pole terminal 28 is not straight in cross-sectional shape because of the over-etched portions 64*a*, 65*a*, and cross-sectional areas of the over-etched portions 64*a*, 65*a* are smaller than other portions of the pole terminals 28A. When the pole terminals 28A do not have the triple-layer structure, the resist which is applied to the positions where the pole terminals 28A are formed is removed after the above-mentioned etching process is conducted.

Figure 20A:
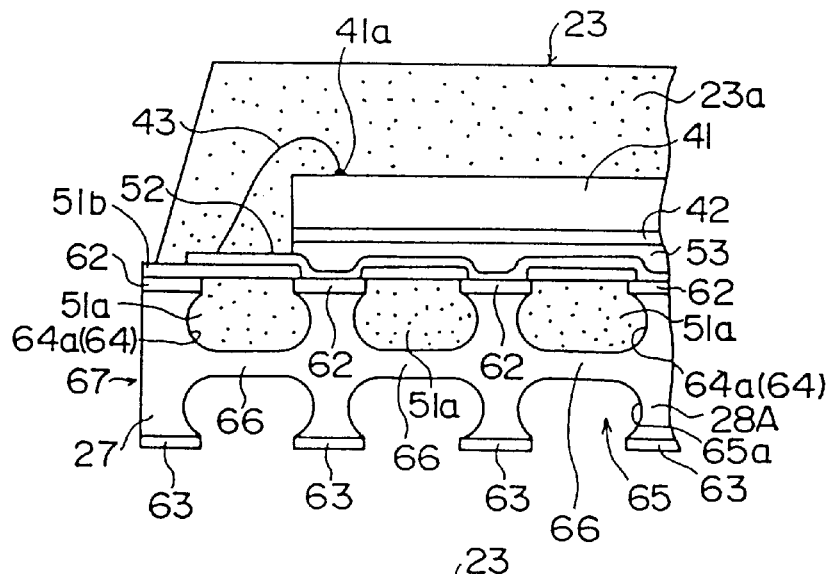
FIGS. 20A, 20B and 20C are schematic illustrations showing a continuation of the method for producing the semiconductor device of the third embodiment of the present invention.

Subsequently, in the etching portions 64 formed in the outer terminal 67, which are etching portions on which the semiconductor chip 41 is mounted, a glass or an epoxy resin is filled to form the first insulating layer 51a. Next, by conducting the steps similar to those described in FIGS. 16B, 16C and 16D, the second insulating layer 51b, the pattern layer 52 and the third insulating layer 53 are formed sequentially. The semiconductor chip 41 is mounted on the third insulating layer 51b through the adhesive 42 (i.e. silver paste). The pads 41a provided in the semiconductor chip 41 are electrically connected to the pattern layer 52 through the wires 43. After that, the semiconductor chip 41 is sealed by the resin 23a to form the resin portion 23. The semiconductor device at this stage is shown in FIG. 20A.

Figure 20B:
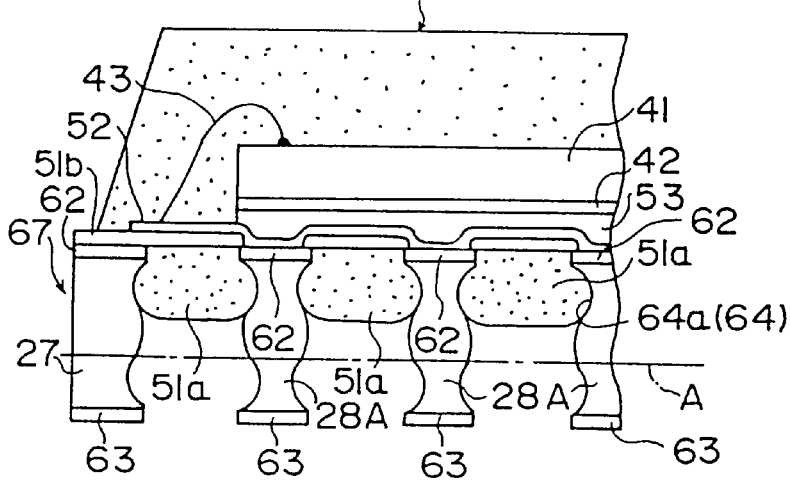

Next, the thin portions 66 are removed by an etching process. FIG. 20B shows the semiconductor device in which the thin portions 66 are removed by the etching process. As an etching liquid in this case, an ammonia etching liquid, which does not etch the outer layer portion 63, can be used. By using the etching liquid which does not etch the outer layer portion 63, only the inner layer portion 61 can be etched and only the thin portions can be removed.

Although the above etching liquid also etches the pole terminals 28A and the frame terminal 27, an amount etched thereof is less than that of the thin portions since the outer layer portions 63 function as resists. Accordingly, the pole terminals 28A and the frame terminal 27 is not etched vertically, and a height of the pole terminals 28A and the frame terminal 27 remains the same as that of the clad metal 60 shown in FIG. 19A.

By the outer terminal 67 being made from the triple-layer structure clad metal 60 shown in FIG. 19A, the pole terminals 28A and the frame terminal 27 can be made uniform in height and a reliability and packaging characteristics of the semiconductor device 21G can be improved.

Figure 20C:
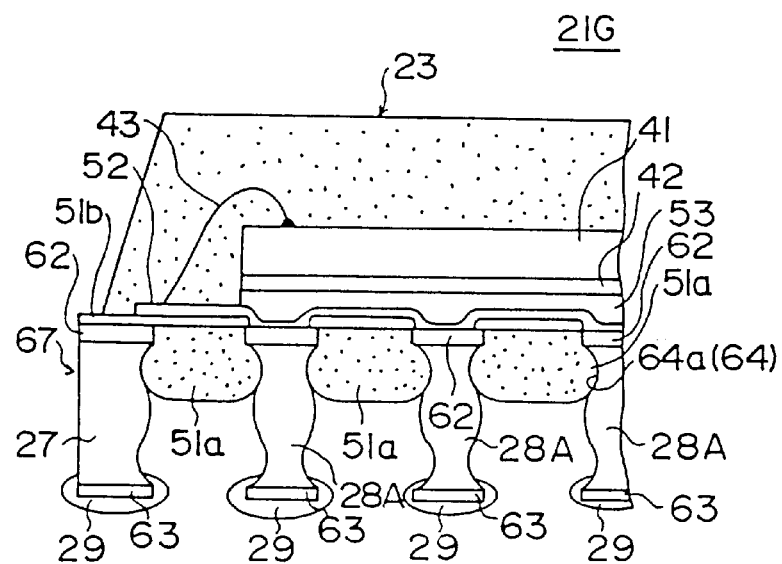

Next, the solder portions 29 are provided on the exposed portions of the pole terminals 28A from the first insulating layer 51a and a prescribed portion of the frame terminal 27 by dipping the portions in solder. In this case, since the over-etched portions 65a are formed in the pole terminals 28A and the frame terminal 27, the solder is properly placed in the portions and the solder portions 29 can be provided securely. Also, thin layers instead of the solder portions 29 can be provided in the exposing portion of the pole terminal 28A from the first insulating layer 51a and the prescribed portion of the frame terminal 27 by a plating process or a sputtering process. Through the above processes, the semiconductor device 21G shown in FIG. 20C is produced.

Hereinafter, the pole terminals 28A and the first insulating layer 51a of the semiconductor device 21G is described.

In the half-etching process shown in FIG. 19C of this embodiment, since the over-etched portions 64a are formed in the etching portions 64, the pole terminal has a wavy shape. The wavy portions of the pole terminals 28A are filled with the first insulating layer 51a. Accordingly, the wavy portions of the pole terminal 28A functions as a mechanism for preventing a separation for preventing the pole terminal 28A from being separated from the resin portion 23. Therefore, the pole terminals 28A can be prevented from being separated from the resin portion 23 and a reliability of the semiconductor device 21G can be improved.

Figure 21B:
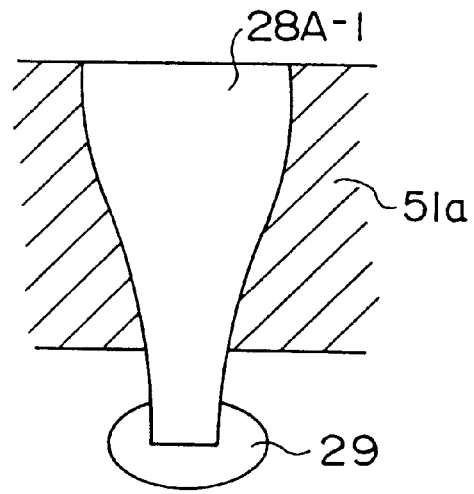
Figure 21C:
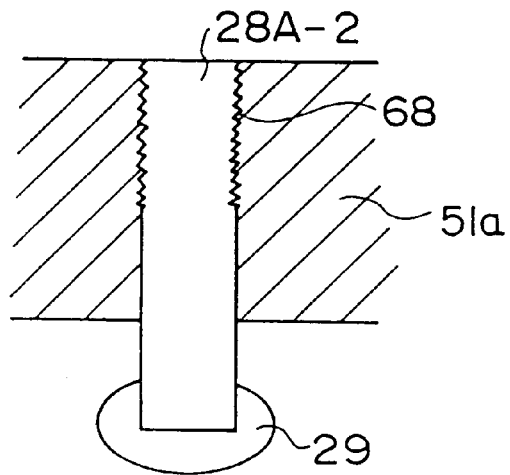

FIGS. 21A, 21B and 21C show variations of the mechanism for preventing a separation. FIG. 21A shows the mechanism for preventing a separation in which the pole terminal 28A is formed in a reel shape. The pole terminal 28A of this shape is prepared when it is made from one simple metal member. That is, in the process shown in FIG. 20B, when the etching for removing the thin portions 66 is conducted without the outer layer portions 63, the pole terminals 28A and the frame terminal 27 are also etched. When the etching is done to the position shown as a one dotted chain line in FIG. 20B, the pole terminal 28A is formed in a reel shape. By making the pole terminal in the reel shape, the pole terminal can be prevented from being separated from the resin portion 23.

In FIG. 21B, a pole terminal 28A-1 is formed in a trapezoid shape. In order to make the pole terminal 28A-1 a trapezoid in shape, a width of the outer layer portion 63 located under the inner layer 61 is formed greater than that of the outer layer portion 62 located above the inner layer in the patterning process shown in FIG. 19B. In this manner, the pole terminal 28A-1 having the trapezoid shape can be formed easily. By the pole terminal 28A-1 being shaped as the trapezoid, the pole terminal 28A-1 has an anchor effect since a sectional area of an upper part of the pole terminal 28A-1 is smaller than that of a lower part thereof. Accordingly, the pole terminal 28A-1 can be prevented from being separated from the resin portion 23 and a reliability of the semiconductor device 21G can be improved.

In FIG. 21C, a mechanism for preventing a separation is realized by a rough face 68 formed in the surface of a pole terminal 28A-2. The rough face 68 can be formed by using a powerful acid after the half-etching process shown in FIG. 19C is conducted. By forming the rough face 68 in the pole terminal 28A-2, the pole terminal 28A-2 can have an anchor function and be prevented from being separated form the resin portion 23.

Figure 22:
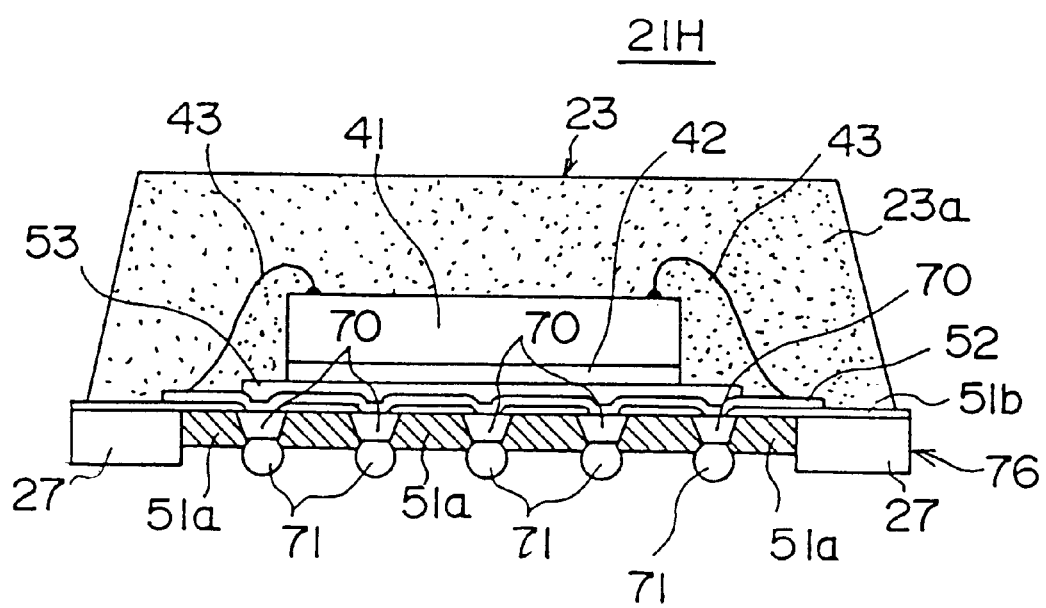
FIG. 22 is a sectional view showing a semiconductor of a fourth embodiment of the present invention.

Next, referring to FIG. 22, a semiconductor device 21H of a fourth embodiment of the present invention will be described. FIG. 22 is a sectional view showing a semiconductor device 21H. In this embodiment, the same features as those previously described in the third embodiment shown in FIGS. 18–20 are donated by the same reference numerals and descriptions thereof are omitted.

Figure 1A:
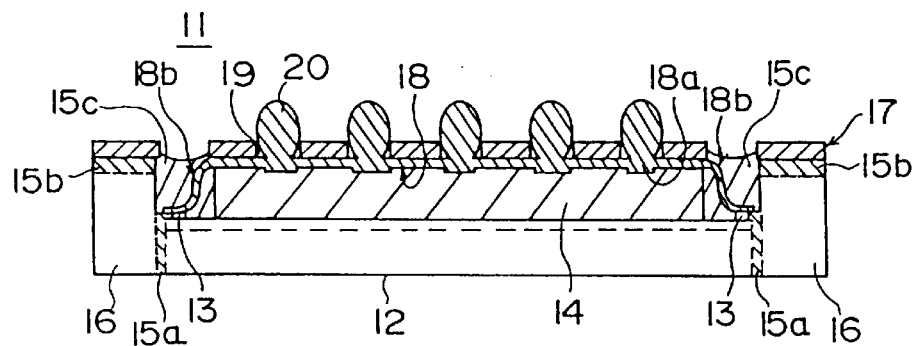
FIG. 1A is a sectional view showing a conventional μBGA-package-type semiconductor device.
Figure 1B:
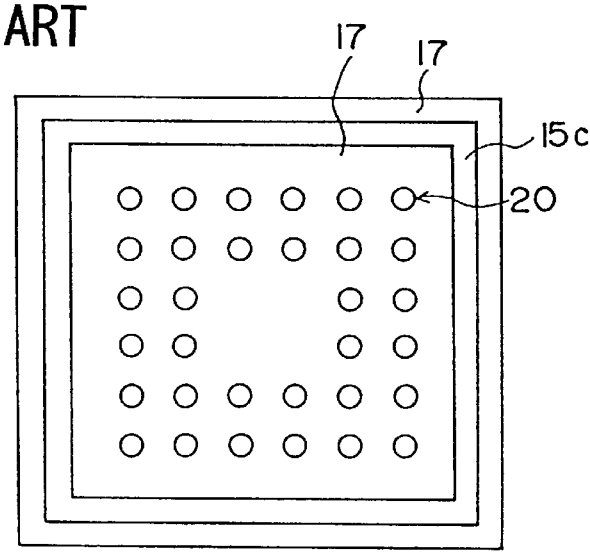
FIG. 1B is a plan view showing the conventional μBGA-package-type semiconductor device.

A semiconductor device 21H of this embodiment is characterized in that solder bumps 71 are provided in pole terminals 70. By providing the solder bumps 71 in the pole terminals 70, the semiconductor devices 21A–21G described in the above embodiment can be mounted on a substrate in the manner that the conventional BGA-type semiconductor device (FIG. 1) is mounted. Accordingly, a flexibility of the semiconductor device 21H can be improved.

Figure 23A:
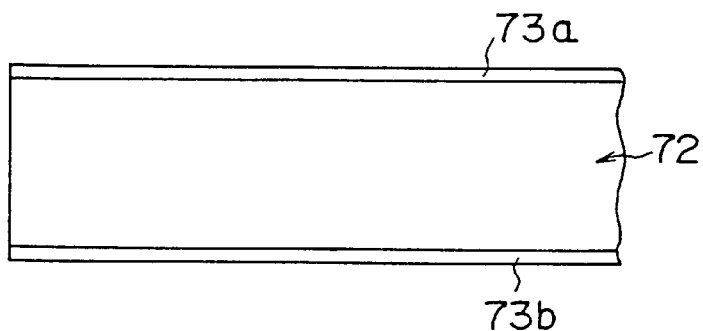
FIGS. 23A, 23B are schematic illustrations showing a method for producing the semiconductor device of the fourth embodiment.
Figure 24A:
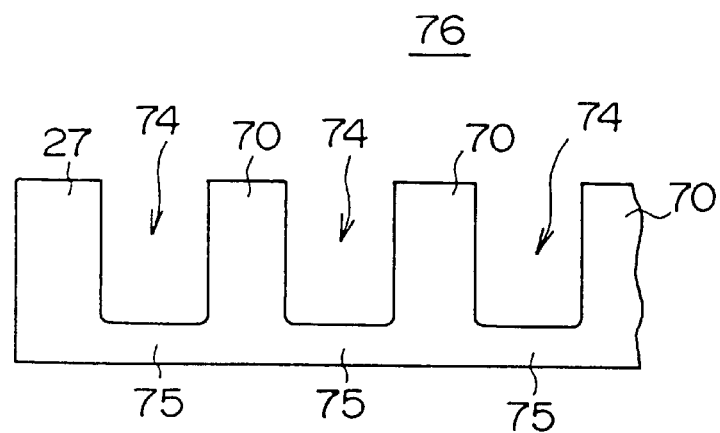
FIGS. 24A, 24B and 24C are schematic illustrations showing a continuation of the method for producing the semiconductor device of the fourth embodiment.
Figure 24B:
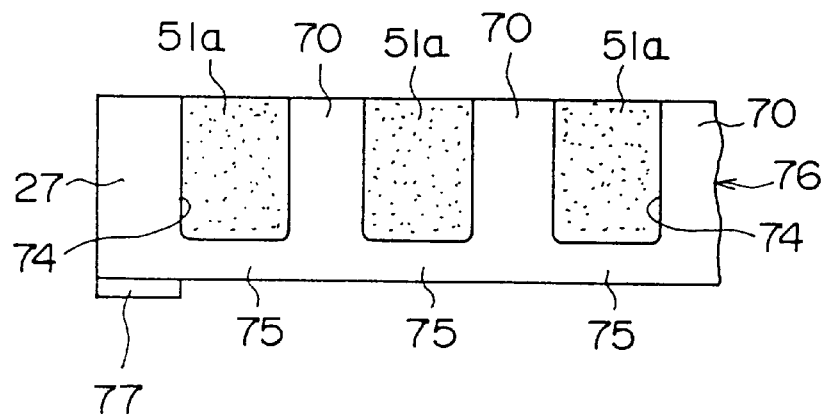
Figure 24C:
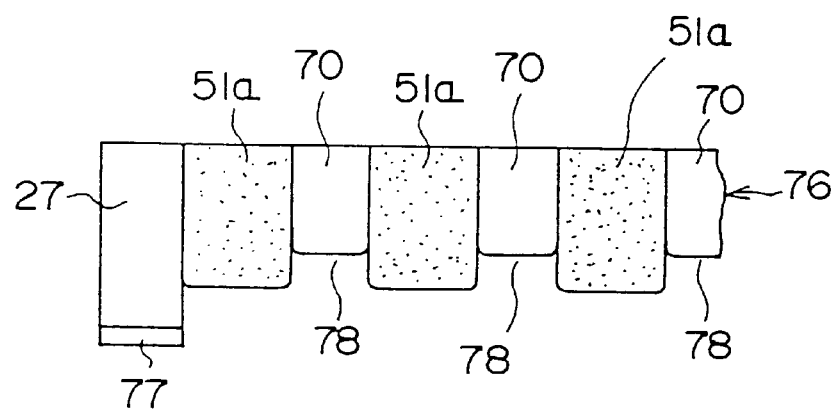
Figure 25A:
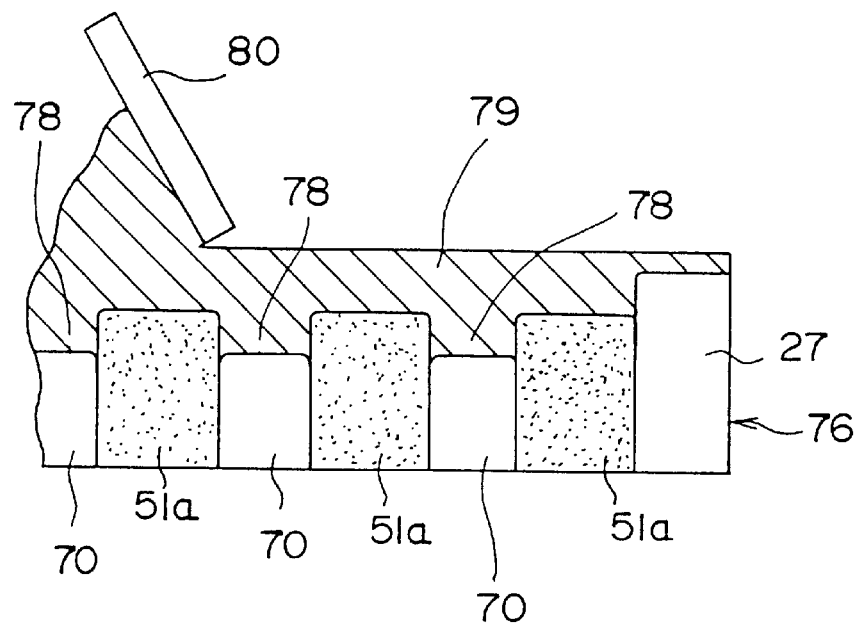
FIGS. 25A and 25B are schematic illustrations showing a continuation of the method for producing the semiconductor device of the fourth embodiment.
Figure 25B:
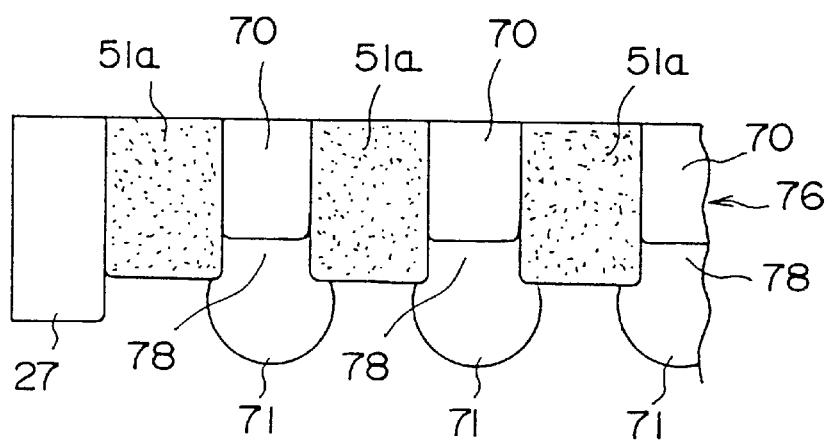

Referring to FIGS. 23–25, a method for producing the semiconductor device 21H will be described. In a process for producing the semiconductor device 21H, a metal plate 72 made of, for example, copper or copper alloy is prepared. On both surfaces of the metal plate 72, resists 73a, 73b are supplied, as shown in FIG. 23A.

Figure 23B:
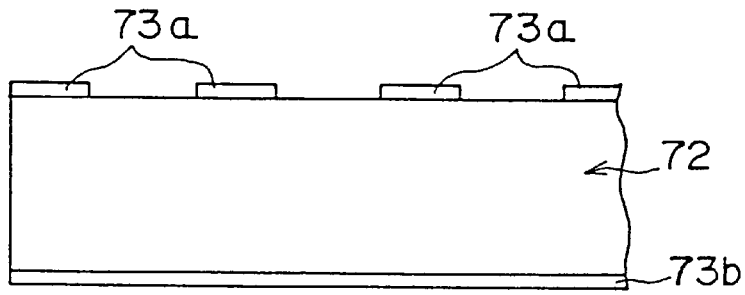

Next, a patterning process is conducted on the resists 73a, 73b. The patterning process is conducted only on the resist 73a applied on an upper surface of the metal plate 72 so that the resist 73a facing the position at which the existing pole terminals 70 are formed remains as shown in FIG. 23B. The resist 73b applied on the lower surface of the metal plate 72 is not patterned but covers the whole lower surface of the metal plate 72.

After the patterning to the resist 73a described above, the upper surface on which the resist 73a is provided and a semiconductor chip 41 will be mounted is half-etched to form etching portions 74. By the half-etching process, thin portions 75 are formed under the etching portion 74. That is, a prescribed number of the pole terminals 70 formed by the half-etching are connected via the thin portions 75. After the above half-etching process, the resists 73a, 73b are removed to form pole terminals 76 shown in FIG. 24A.

Next, a glass or an insulating resin is filled into the etching portions 74 formed in the outer terminal 76 to form the first insulating layer 51a. On the lower surface of the outer terminal 76 at positions which correspond to the frame terminals 27, a resist 77 is applied as shown in FIG. 24B.

Subsequently, the second insulating layer 51b, the pattern layer 52 and the third insulating layer 53 are formed sequentially by similar processes to that described with reference to FIGS. 16B and 16C. The semiconductor chip 41 is mounted on the third insulating layer 53 through the adhesive 42. The wires 43 are provided between the pads 41a and the pattern layer 52.

The surface of the outer terminal 76 on which the resist 77 is applied is etched to remove the thin portions 75. In this case, the etching is continued even after the thin portions 75 are removed, as shown in FIG. 24C. By the etching process, the pole terminals become shorter than the first insulating layer 51a and recess portions 78 are formed between the first insulating layers 51a and the pole terminals 70. After the etching for removing the thin portions 75 and the part of the pole terminal 70, the resist 77 is removed.

On the surface of the outer terminal 76 on which the recess portions 78 are formed, a solder paste 79 is applied using a squeegee 80. After the solder paste 79 is applied on the surface of the outer pole terminals on which recess portions 78 are formed, a reflowing treatment is conducted. In this step, a binder included in the solder paste 79 is vapored and removed and only the solder remains. Also, the remaining solder is melted and formed in a spherical shape by a surface tension thereof and attached to the pole terminal 70 to form the solder bump 71. In this case, since solder is not attachable to the first insulating layer 51a made of glass or resin and the melted solder flows into the recess portions 78 in which the pole terminals 70 are provided, the solder bumps 71 are formed only at a position at which the pole terminals 70 are provided.

The solder bumps 71 are formed at desired positions at which the pole terminals 70 are provided by simply applying the solder paste 79 in the outer terminals 76 and conducting the ordinal reflowing treatment. Accordingly, the solder bumps 71 can be formed easily and economically. Through the above processes, the semiconductor device 21H is produced.

In the above-described processes (reflowing-soldering method), the solder paste 79 is applied on the outer terminal 76 and the reflowing treatment is conducted in order to form the solder bumps 71. However, the method for producing the solder bumps 71 is not limited to the above-described method. For example, a dipping soldering method can be used in order to form the solder bumps 71.

Figure 26A:
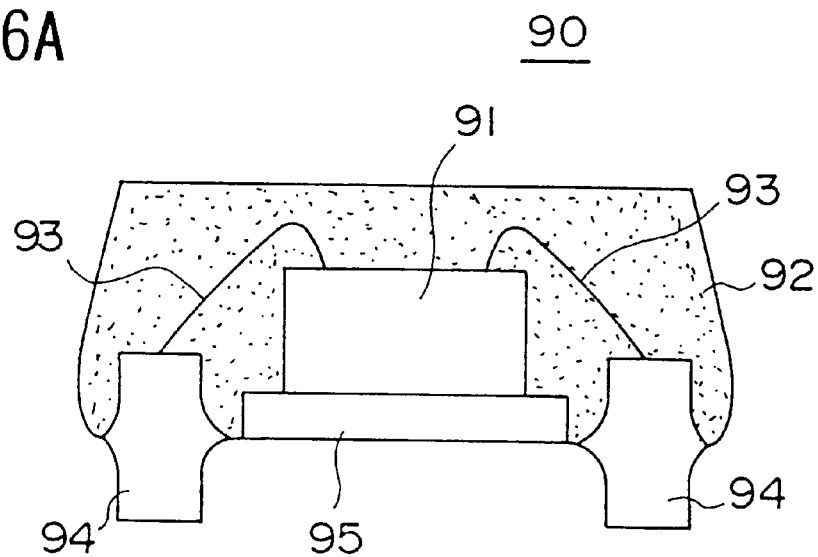
FIG. 26A is a sectional view showing a semiconductor device of a fifth embodiment of the present invention.
Figure 26B:
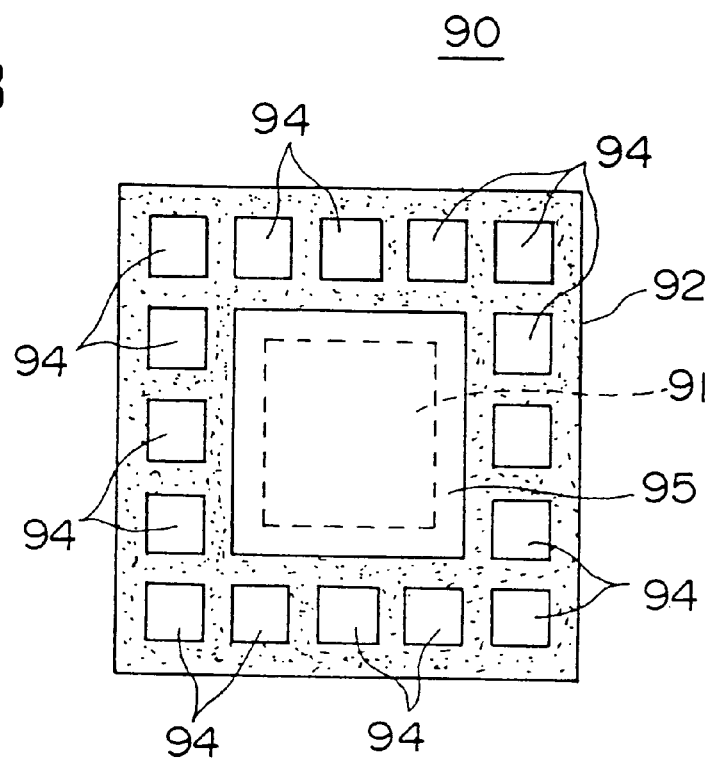
FIG. 26B is a rear view showing the semiconductor device of the fifth embodiment.

Next, referring to FIG. 26A and 26B, a semiconductor device 90 of a fifth embodiment of the present invention is described. FIG. 26A is a sectional view showing the semiconductor device 90 and FIG. 26B is a rear view thereof.

The semiconductor device 90 of this embodiment has a simple structure comprising a semiconductor chip 91, a resin package 92, wires 93 and pole terminals 94. As is apparent in FIG. 26A, the semiconductor device 90 has a structure similar to the plastic PGA (Pin Grid Array) package. However, the semiconductor device 90 is characterized in that no circuit substrate is provided in a package, as will be described later.

The semiconductor chip 91 is mounted on a pad material made of an adhesive, which is exposed from the resin package 92. Accordingly, since heat generated in the semiconductor chip 91 can be released, a heat release efficiency can be improved. A plurality of (in this embodiment, 16) pole terminals 94 are arranged close around the semiconductor chip 91. The pole terminals 93 are extending vertically. A top end of the pole terminal 94 is plated with, for example, silver, gold or palladium, which makes it possible to apply a bonding treatment thereon. The pole terminals 94 are made of, for example, a copper or a copper alloy.

Between the top ends of the pole terminals 94 and pads (not shown) provided on the semiconductor chip 91, the wires 93 are provided in order to electrically connect the pole terminals to the semiconductor chip 91. Top portions of the pole terminals 93 and the semiconductor chip 91 except a connecting surface to the pad materials is sealed by the resin package 92. By this structure, the semiconductor chip 91, connecting portions of the wires 93 and the top portions of the pole terminals are protected by the resin package 92. The lower ends of the pole terminals 93 protrude downward from the resin package 92. The protruding portions of the pole terminals 93 from the resin package 92 function as outer connection terminals when the semiconductor device 90 is mounted on a substrate (not shown).

Next, the semiconductor device 90 having such a structure is compared with conventional semiconductor devices which are commercially available. Comparing the semiconductor device 90 having such a structure with the plastic PGA-package-type semiconductor device, in the plastic PGA-package-type semiconductor device, since a semiconductor chip is electrically connected to pins, a circuit substrate is provided in a resin package. On the other hand, in the semiconductor device 90, the semiconductor chip 91 and the pole terminals 93 are connected in series through the wires 93. Accordingly, the semiconductor device 90 of this embodiment is simple in structure, and is low in height, and can be produced economically.

Comparing a semiconductor device 90 with a QFP (Quad Flat Package) type semiconductor, in the QFP-type semiconductor device, outer leads are outward extending from a periphery of a resin package. On the other hand, in the semiconductor 90, the pole terminals are extending vertically. Accordingly, by the semiconductor device 90, a mounting area can be reduced and the package structure can be decreased in size.

The semiconductor device 90 of this embodiment is compared with TQFP (Thin Quad Flat L-Leaded Package) 80-pin type semiconductor device and SSOP (Shrink Small Outline L-Leaded Package) 20-pin type semiconductor, which are semiconductors commercially available having a small-size package.

A results are shown in TABLE 1.

TABLE 1

| PACKAGE | TPFP 80PINS | PRESENT EMBODIMENT 80PINS | SSOP 20PINS | PRESENT EMBODIMENT 20PINS |
|---|---|---|---|---|
| TERMINAL PITCH | 0.40 | 0.50 | 0.65 | 0.65 |
| PACKAGE WIDTH | 12.00 | 10.00 | 6.50 | 4.40 |

TABLE 1-continued

| PACKAGE | TPFP 80PINS | PRESENT EMBODIMENT 80PINS | SSOP 20PINS | PRESENT EMBODIMENT 20PINS |
|---|---|---|---|---|
| PACKAGE LENGTH | 12.00 | 10.00 | 6.65 | 6.65 |
| PACKAGE HEIGHT | 1.20 | 0.75 | 1.20 | 0.75 |

(unit: mm)

As is apparent from the TABLE 1, the semiconductor device 90 of this embodiment can be decreased in size and in height compared to the conventional semiconductor device having the small-size package.

Next, referring to FIGS. 27 and 28, a method for producing the semiconductor device 90 of this embodiment will be described.

Figure 28A:
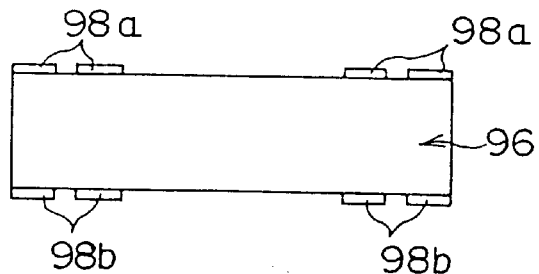
FIGS. 28A, 28B, 28C and 28D are schematic illustrations showing a method for producing the semiconductor device of the fifth embodiment.

In the method for producing the semiconductor device 90, a metal plate 96 of copper or copper alloy, shown in FIG. 28A is prepared. The pole terminal 94 and frame portion 97 are made from the metal plate 96. At positions of the metal plate 96 which will be the pole terminals 94 and the frame portion 97, resists 98a, 98b are applied.

Figure 28B:
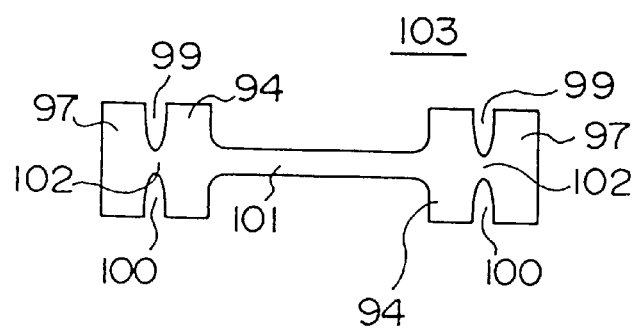
Figure 28C:
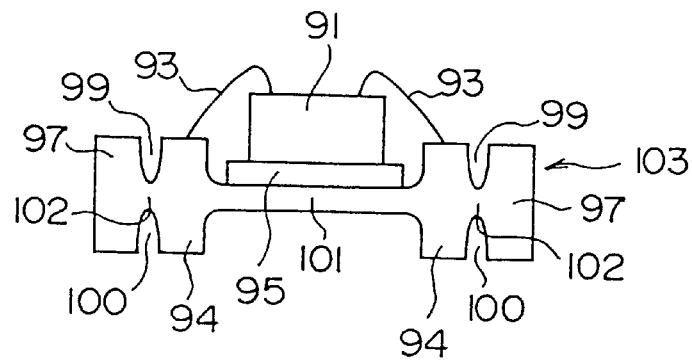

After the resists 98a, 98b are applied on the metal plate 96, both surfaces or one (in this embodiment, both) surface of the metal plate is half-etched to form grooves 99, 100 in the metal plate 96, as shown in FIG. 28B. In this case, since both surfaces of the metal plate 96 are half-etched, thin portions 101, 102 are formed in central portions of the metal plate 96. By forming grooves 99, 100, the pole terminals 94 and the frame portions 97 are formed. However, in this step shown in FIG. 28B, each of the terminal portions 94 and the frame portions is not completely independent, but is connected to the others through the thin portions 101, 102.

After the half-etching process, the resist 98a, 98b applied in the metal plate is removed. Next, in upper ends of the pole terminals 94 on which the semiconductor chip 91 is mounted, bonding pads 104 to which wires 93 are bonded are formed by plating. The upper ends of the pole terminals 94 are plated by, for example, silver (Ag), gold (Au) or palladium (Pd). By the above-mentioned processes, the outer terminal 103 is formed.

In this embodiment, only the upper-end portion of the pole terminals are plated to form the bonding pads 104 for wire bonding. However, the whole surface of the outer terminal 103 on which the semiconductor chip 91 is mounted (pole terminals 94, frame portions 97, inner surfaces of grooves 99, 100 and an upper surface of the thin portion 104) can be plated.

Figure 27A:
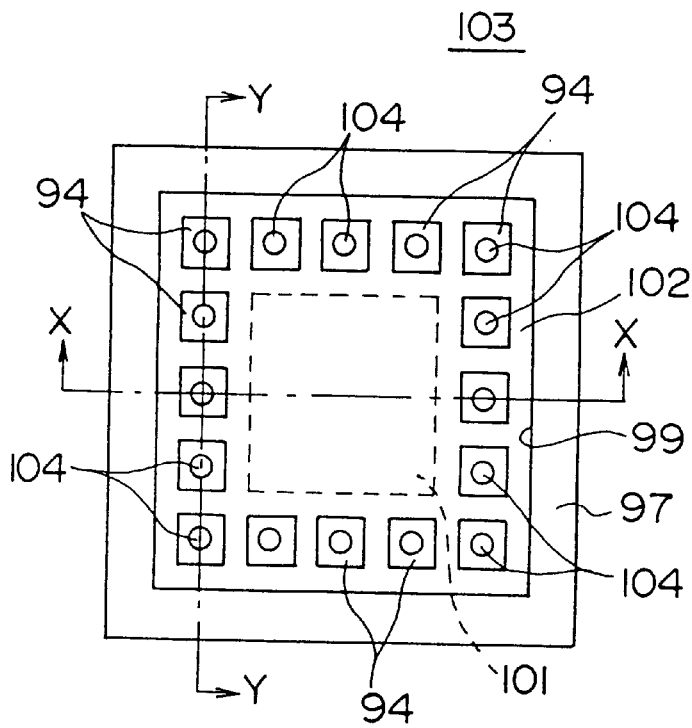
FIG. 27A is a plan view showing an outer terminal portion of the fifth embodiment.
Figure 27B:
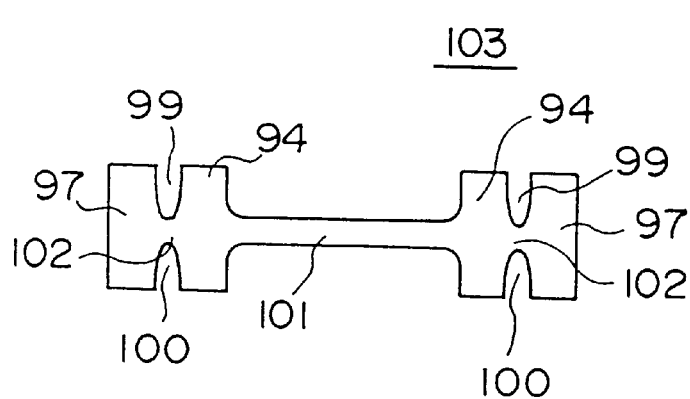
FIG. 27B is a sectional view taken on line X—X in FIG. 27A.
Figure 27C:
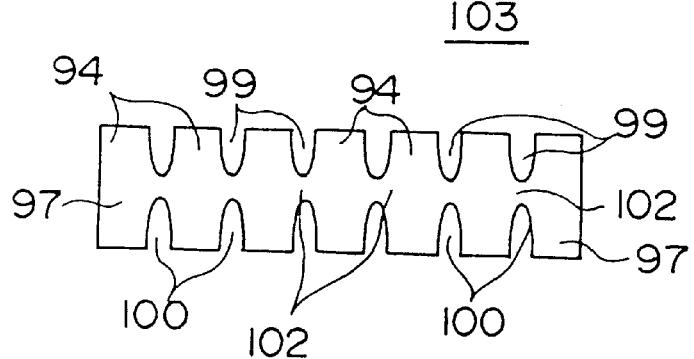
FIG. 27C is a sectional view taken on line Y—Y in FIG. 27A.

FIGS. 27A, 27B and 27C are enlarged views showing the outer terminal 103. FIG. 27A is a plan view, FIG. 27B is a sectional view taken on line X—X in FIG. 27A and FIG. 27C is a sectional view taken on line Y—Y in FIG. 27A.

As shown in FIGS. 27a, 27B and 27C, the pole terminals 94 are arranged close to the semiconductor device 91 (shown as dotted line in FIG. 27A) so as to surround the semiconductor chip 91. Also, the pole terminals 94 are surrounded by the frame portion 97 through the grooves 99, 100. Since the thin portion 101 on which the semiconductor chip 91 is mounted is a plate portion, the semiconductor chip 91 can be mounted easily.

Referring back to FIG. 28, the method for producing the semiconductor device is described.

After the outer terminals 103 are formed as described above, the semiconductor chip 91 is mounted on the upper surface on the thin portion 101 (the surface on which the bonding pads are formed) through the pad material 95 of an adhesive. As described above, the thin portion 101 is a flat plate and the semiconductor chip 91 is mounted on the thin portion through the pad material 95, so that the semiconductor chip 91 can be properly mounted without the semiconductor chip being declined.

The wires 93 are provided between the pads (not shown) and the bonding pads plated on the upper end of the pole terminals 94. By the wires 93, the semiconductor chip 91 is electrically connected to the pole terminals 94.

Figure 28D:
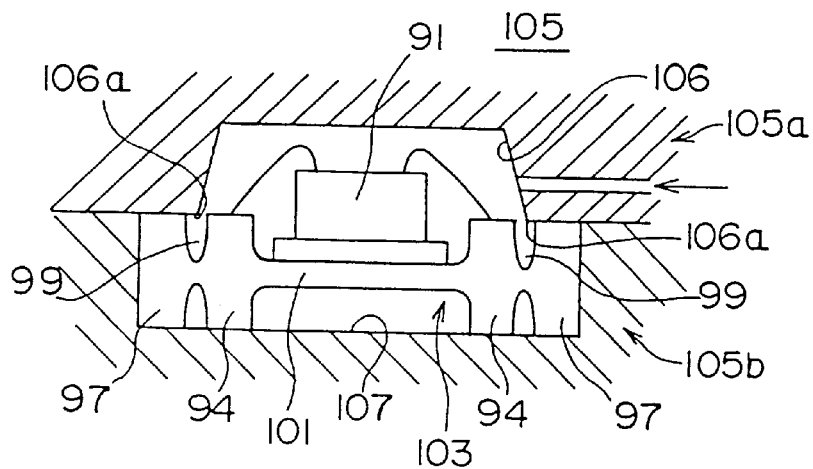

After the semiconductor chip 91 and the outer terminals 103 on which wires are provided are placed in a mold 105 as shown in FIG. 28D, a resin molding is conducted in order to form the resin package 92. The mold 105 comprises an upper mold 105a and a bottom mold 105b. In the upper mold 105a, a cavity 106 corresponding to a shape of the package 92 is formed.

In the cavity 106 formed in the mold 105, the outer terminal portion 103 is clamped between the upper mold 105a and the bottom mold 105b. An edge portion 106a of the cavity 106 is positioned in the groove 99 formed between the frame portion 97 and the pole terminals 94. That is, the edge portion 106b of the cavity 106 is positioned in the middle of the groove 99.

As described later, the frame portion 97 is separated and removed from the pole terminals 94 at the position where the groove 99 is formed. By setting the edge portion 106a of the cavity 106 in the central portion of the groove 99, the thickness of the separating portion can be thinner and the separation process of the frame portion 97 from the pole terminals 94 can be conducted easily.

In the resin molding process shown in FIG. 28D, the resin is filled only into the cavity 106 formed by the upper mold 105a but not into the cavity 106 formed by the bottom mold 105b.

Figure 29A:
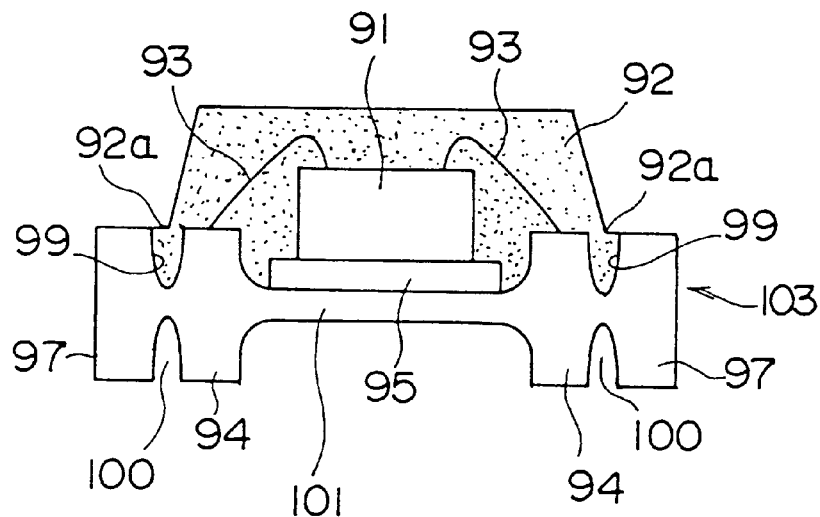
FIGS. 29A and 29B are schematic illustrations showing the method for producing the semiconductor device of the fifth embodiment.

FIG. 29A shows the outer terminal 103 in which the resin package 92 is formed. As described above, by setting the edge portion 106a of the cavity 106 to the central portion of the groove 99, the edge portion of the resin package is positioned on the central portion of the groove 99. Since the resin is filled into the groove 99 also, an upper side of the outer terminal 103 is covered with the resin package 92.

Subsequently, the thin portions 101, 102 are removed by an etching process. In this case, the etching process is conducted to an opposite surface of the outer terminal 103 to that on which the resin package is formed. That is, the etching process to the thin portions 101, 102 is conducted only to one surface of the outer terminal 103.

Figure 29B:
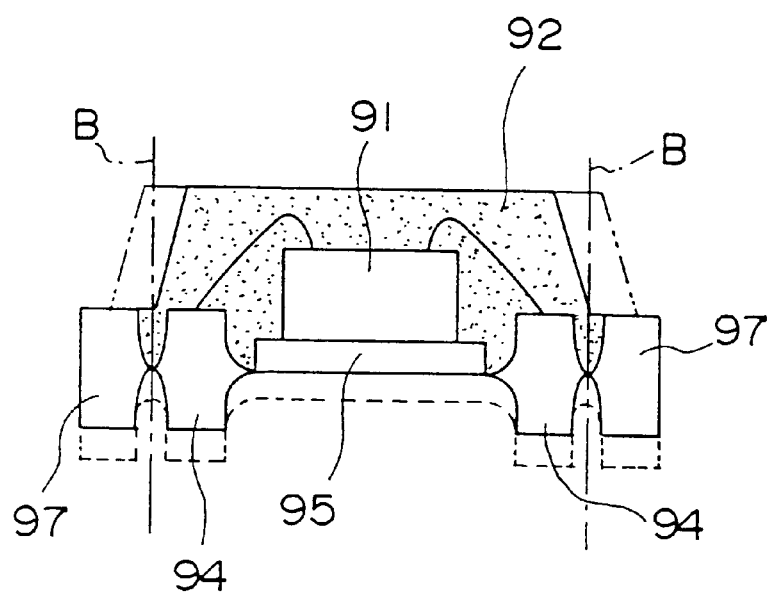

By the etching process, the thin layer portions 101, 102 are removed, the pad material 95 is exposed form the resin package 92, and the pole terminals are completely separated from the frame portion as shown in FIG. 29B. However, since the resin constituting the resin package 92 is formed between the pole terminal 94 and the frame portion 97, the frame portion 97 is not separated from the semiconductor device 90 in this step.

After the etching process, the resin package 92 is cut at portions shown by a one dotted chain line in FIG. 29B to separate the frame portion 92 from the semiconductor device 90 completely. Since the outer end portion 92a of the resin package 92 is positioned in the middle of the groove 99, this separation process can be conducted easily in this embodiment compared to a semiconductor device in which a resin package 92 is formed to the position shown by a two dotted chain line.

Next, a solder treatment is conducted to the pole terminals 94 of the separated and independent semiconductor device 90. In this case, the solder treatment is conducted to protruding portions of the pole terminals 94.

The above-mentioned solder treatment is conducted by dipping the protruding portions of the pole terminals 94 in a solder bath. Where the plating supplied in the above step remains in the semiconductor device 90, the plating is absorbed by the solder (or is rinsed by the solder).

In this step, both the soldering to the pole terminals 94 and the removal of the remaining plating can be conducted at the same time. The treatment to the pole terminals 94 is not limited to the soldering but a non-electrolytic plating can be conducted to the pole terminals 94 in order to form metallic layers on the pole terminals 94.

By the above-mentioned steps, the semiconductor device 90 shown in FIG. 27A and 27B can be produced. In the method for producing the semiconductor 90 described above, the steps described with reference to FIG. 28C, FIG. 28D and FIG. 29A are conventional steps for forming the resin package. Accordingly, existing equipments can be utilized for a production of the semiconductor device 90. This feature also reduces a cost for producing the semiconductor device 90.

Figure 30A:
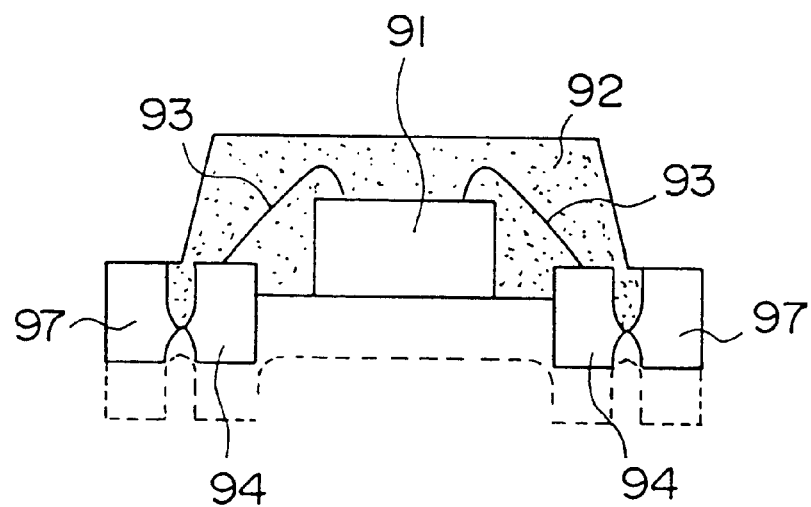
FIGS. 30A and 30B are schematic illustrations showing a variation of the method for producing the semiconductor device of the fifth embodiment.

FIG. 30 is a schematic illustration showing a variation of method for producing a semiconductor device 90 of the fifth embodiment. In the above-described embodiment, the etching process described with reference to FIG. 29B is finished when the thin portions 101, 102 are removed. However, this variation is characterized in that the pad material 95 is removed after the thin portions 101, 102 are removed as shown in FIG. 30A. The removal of the pad material 95 made of an adhesive can be done by using a solvent for resolving the pad material 95 or by a mechanical processing.

Figure 30B:
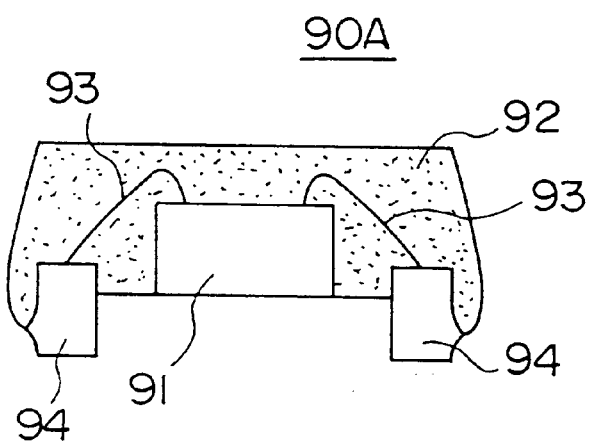

FIG. 30B shows the semiconductor device 90 in which the pad material 95 is removed as described above. As shown in FIG. 30B, by the removal of the pad material 95, the semiconductor device 90A can be further reduced both in size and in height. Also, since a bottom surface of the semiconductor chip 91 is exposed, a heat release efficiency of the semiconductor chip can be further improved.

Figure 31:
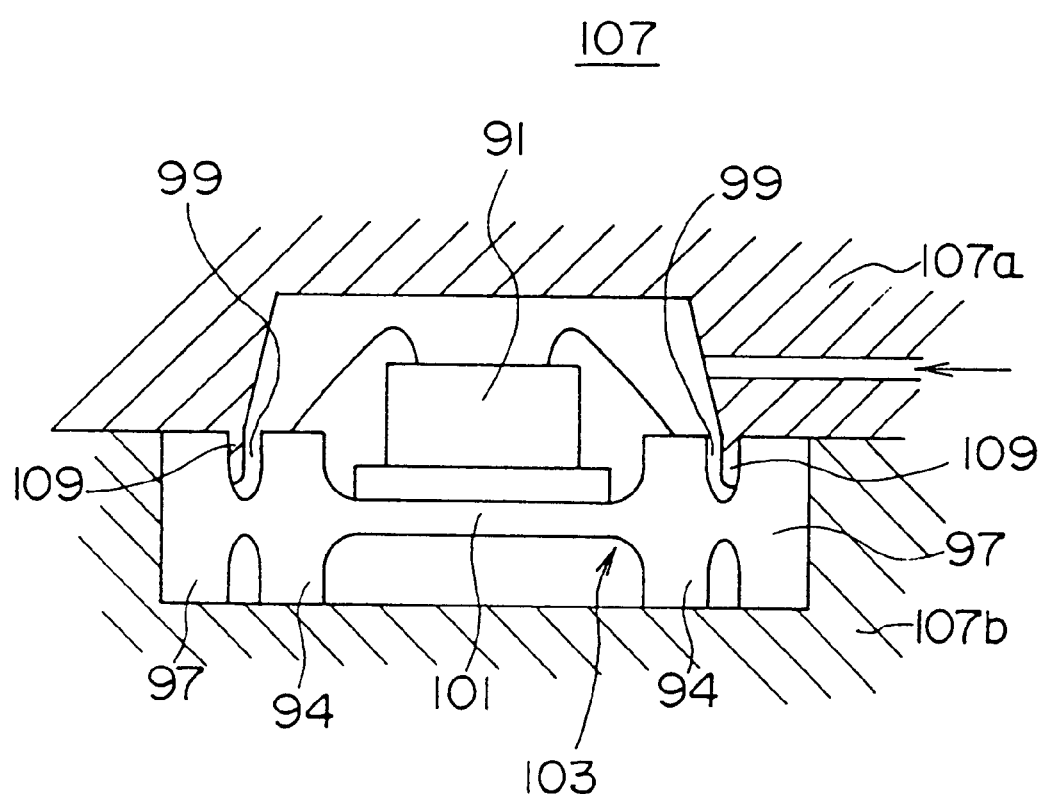
FIG. 31 is a sectional view showing a variation of a mold used in a resin molding step.

FIG. 31 shows a variation of the mold used in the resin molding step. In the mold 105 shown in FIG. 28D, the edge portion 106a of the cavity 106 formed by the upper mold 105a is positioned in the groove 99 formed between the frame portion 97 and the pole terminal 94 so that the frame portion 97 can be separated easily.

A mold 107 of this variation is characterized in that in a edge portion of a cavity 108 formed by an upper mold 107a, a projection 109 is provided to be inserted into the groove 99. By providing the projection 109 to be inserted into the groove 99, the resin package 92 at the separating portion can be made thinner, and the separation process can be conducted more easily. Also, since a position of the outer terminal 103 is determined by the projection 109 in the mold 107, a molding accuracy of the resin package to the outer terminal 103 can be improved.

In the above description of the embodiments and the drawings, only one outer terminal is made from the clad metal or the metal plate, and the semiconductor device is produced using the outer terminal, for a better understanding of the present invention. However, in the methods for producing the semiconductor device described above, a plurality of outer terminals can be made from the clad metal or the metal plate and the plurality of semiconductor devices can be produced at the same time. By this method, a production efficiency can be improved and a cost for the semiconductor device can be reduced.

Further, the present inventions are not limited to these embodiments, but various variations and modifications may be made without departing form the scope of the present invention.

What is claimed is:

1. A semiconductor device comprising:
    a semiconductor chip having a plurality of pads;
    a resin portion sealing said semiconductor chip; and
    a terminal portion in which a prescribed number of pole terminals are provided, said pole terminals being electrically connected to said pads provided with said semiconductor chip;
    an insulating layer portion provided so that said pole terminals partially project from said insulating layer portion; and
    solder balls respectively provided to said pole terminals so that said solder balls cover projecting portions of said pole terminals.

2. The semiconductor device according to claim 1, wherein said pole terminals are arranged in a lattice formation and at least said frame terminal is arranged to completely surround said pole terminals.

3. The semiconductor device according to claim 2, wherein said terminal portion comprises,
    an outer terminal comprising said frame terminal and said pole terminals, and
    a pattern portion comprising connecting portions on which said semiconductor chip is mounted, said connecting portions being connected to said pads, and terminal connecting portions connected to said frame terminal and said pole terminals.

4. The semiconductor device according to claim 3, wherein said pattern portion comprises,
    a base layer on which said semiconductor chip is mounted, and
    a pattern layer in which said connecting portions and said terminal connecting portions are provided, said pattern layer being formed on said base layer.

5. The semiconductor device according to claim 4, wherein said base layer is made of one of an insulating film and a metal plate member.

6. The semiconductor device according to claim 5, wherein an opening portion is formed in said base layer at a position corresponding to said connecting portions of said pattern layer, and said pads provided in said semiconductor chip are electrically connected to said connecting portions through wires.

7. The semiconductor device according to one of claims 4–6, wherein said connecting portions of said pattern layer are arranged above said frame terminal provided in a periphery of said outer terminal.

8. The semiconductor device according to claim 6, wherein said pads provided in said semiconductor chip are arranged in two lines along edges of said semiconductor chip, and said connecting portions of said pattern layer are arranged in a staggered formation to said pads.

9. The semiconductor device according to claim 8, wherein said pads arranged close to said connecting portions are connected to said connecting portions arranged close to said semiconductor chip through wires forming arcs of a certain radius, and said pads arranged apart from said connecting portions are connected to said connecting portions arranged apart from said semiconductor chip through wires forming arcs of a different radius.

10. The semiconductor device according to claim 4, wherein the terminal connecting portions of the pattern layer are electrically connected to said pole terminals and said frame terminal in said outer terminal through plating portions.

11. The semiconductor device according to claim 1, wherein said frame terminal functions as one of an power supply terminal and a grounding terminal.

12. The semiconductor device as claimed in claim 1, further comprising frame terminals provided in said terminal portion.

13. A semiconductor comprising:
   a semiconductor chip having a plurality of pads;
   a resin portion sealing said semiconductor chip; and
   a terminal portion in which a prescribed number of pole terminals and a frame terminal are provided, said pole terminals being electrically connected to said pads provided with said semiconductor chip, said pole terminals and said frame terminal being exposed and projected from said resin, said frame terminal being continuous and at least partially surrounding said pole terminals,
   wherein said frame terminal surrounds said resin portion to define an edge of said semiconductor device.

14. The semiconductor device of claim 12, wherein said frame terminals and said pole terminals are formed to lie in a plane.

15. The semiconductor device of claim 12, wherein said frame terminals are formed at substantially the same height as said pole terminals.

* * * * *